(12) United States Patent
Okamoto et al.

(10) Patent No.: US 11,114,308 B2
(45) Date of Patent: Sep. 7, 2021

(54) CONTROLLING OF HEIGHT OF HIGH-DENSITY INTERCONNECTION STRUCTURE ON SUBSTRATE

(71) Applicant: INTERNATIONAL BUSINESS MACHINES CORPORATION, Armonk, NY (US)

(72) Inventors: Keishi Okamoto, Kawasaki (JP); Akihiro Horibe, Yokohama (JP); Hiroyuki Mori, Yasu (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 60 days.

(21) Appl. No.: 16/141,153

(22) Filed: Sep. 25, 2018

(65) Prior Publication Data

US 2020/0098592 A1 Mar. 26, 2020

(51) Int. Cl.
*H01L 21/48* (2006.01)
*H01L 25/00* (2006.01)
*H01L 23/00* (2006.01)
*H01L 23/498* (2006.01)

(52) U.S. Cl.
CPC ...... *H01L 21/4846* (2013.01); *H01L 21/4864* (2013.01); *H01L 23/49838* (2013.01); *H01L 24/83* (2013.01); *H01L 25/50* (2013.01); *H01L 2224/83855* (2013.01)

(58) Field of Classification Search
CPC ..... H01L 21/4846; H01L 25/50; H01L 24/83; H01L 23/49838; H01L 21/4864; H01L 2224/83855
See application file for complete search history.

(56) References Cited

U.S. PATENT DOCUMENTS

| 5,501,938 A | 3/1996 | Ellis et al. |
| 7,151,009 B2 | 12/2006 | Kim et al. |
| 7,566,960 B1 | 7/2009 | Conn |

(Continued)

FOREIGN PATENT DOCUMENTS

| CN | 100576987 C | 12/2009 |
| CN | 206947296 U | 1/2018 |

(Continued)

OTHER PUBLICATIONS

U.S. Office Action issued in U.S. Appl. No. 15/673,954 dated Aug. 15, 2019, 12 pages.

(Continued)

*Primary Examiner* — Selim U Ahmed
(74) *Attorney, Agent, or Firm* — Tutunjian & Bitetto, P.C.; Randall Bluestone

(57) ABSTRACT

An interconnection layer carrying structure for transferring an interconnection layer onto a substrate is disclosed. The interconnection layer carrying structure includes a support substrate, a release layer on the support substrate; and an interconnection layer on the release layer. The interconnection layer includes an organic insulating material and a set of pads embedded in the organic insulating material. The set of the pads is configured to face towards the support substrate. The support substrate has a base part where the interconnection layer is formed and an extended part extending outside the base part.

24 Claims, 15 Drawing Sheets

(56) References Cited

U.S. PATENT DOCUMENTS

| | | |
|---|---|---|
| 8,008,764 B2 | 8/2011 | Joseph et al. |
| 8,866,308 B2 | 10/2014 | Roy et al. |
| 8,872,349 B2 | 10/2014 | Chiu et al. |
| 8,922,739 B2 | 12/2014 | Lan et al. |
| 9,136,236 B2 | 9/2015 | Starkston et al. |
| 9,269,701 B2 | 2/2016 | Starkston et al. |
| 9,349,711 B2 | 5/2016 | Lin et al. |
| 9,601,423 B1 | 3/2017 | Arvin et al. |
| 9,642,259 B2 | 5/2017 | Kim et al. |
| 9,679,843 B2 | 6/2017 | Starkston et al. |
| 9,716,067 B2 | 7/2017 | Mahajan et al. |
| 9,754,890 B2 | 9/2017 | Deshpande et al. |
| 9,831,169 B2 | 11/2017 | Zhang et al. |
| 2002/0185744 A1 | 12/2002 | Katagiri et al. |
| 2003/0222350 A1 | 12/2003 | Sawada |
| 2004/0264837 A1* | 12/2004 | Ogawa ............. H05K 3/4602 385/14 |
| 2012/0043667 A1 | 2/2012 | Rathburn |
| 2013/0168854 A1 | 7/2013 | Karikalan et al. |
| 2013/0181354 A1 | 7/2013 | Kahn et al. |
| 2013/0292846 A1 | 11/2013 | Lee et al. |
| 2014/0070380 A1 | 3/2014 | Chiu et al. |
| 2014/0170814 A1 | 6/2014 | Okuda et al. |
| 2015/0075849 A1 | 3/2015 | Yap et al. |
| 2016/0135292 A1 | 5/2016 | Lee |
| 2017/0025341 A1 | 1/2017 | Chaparala et al. |
| 2017/0287831 A1 | 10/2017 | Starkston et al. |

FOREIGN PATENT DOCUMENTS

| | | |
|---|---|---|
| CN | 107710336 A | 2/2018 |
| DE | 102016124862 A1 | 7/2017 |
| JP | 2013098403 A | 5/2013 |
| JP | 2015214028 A | 12/2015 |

OTHER PUBLICATIONS

Notice of Allowance for U.S. Appl. No. 15/804,364 dated Aug. 27, 2019 (10 pages).

List of IBM Patents or Patent Applications Treated as Related dated Oct. 16, 2018, 2 pages.

Oi, "Development of New 2.5D Package with Novel Integrated Organic Interposer Substrate with Ultra-fine Wiring and High Density Bumps", 2014 Electronic & Technology Conference, May 2014, pp. 348-353.

Office Action issued in U.S. Appl. No. 15/804,364 dated Jun. 15, 2018, 12 pages.

Office Action issued in U.S. Appl. No. 15/673,954 dated Oct. 9, 2018, 11 pages.

International Search Report issued in PCTIB2018055761 dated Dec. 12, 2018, 9 pages.

\* cited by examiner

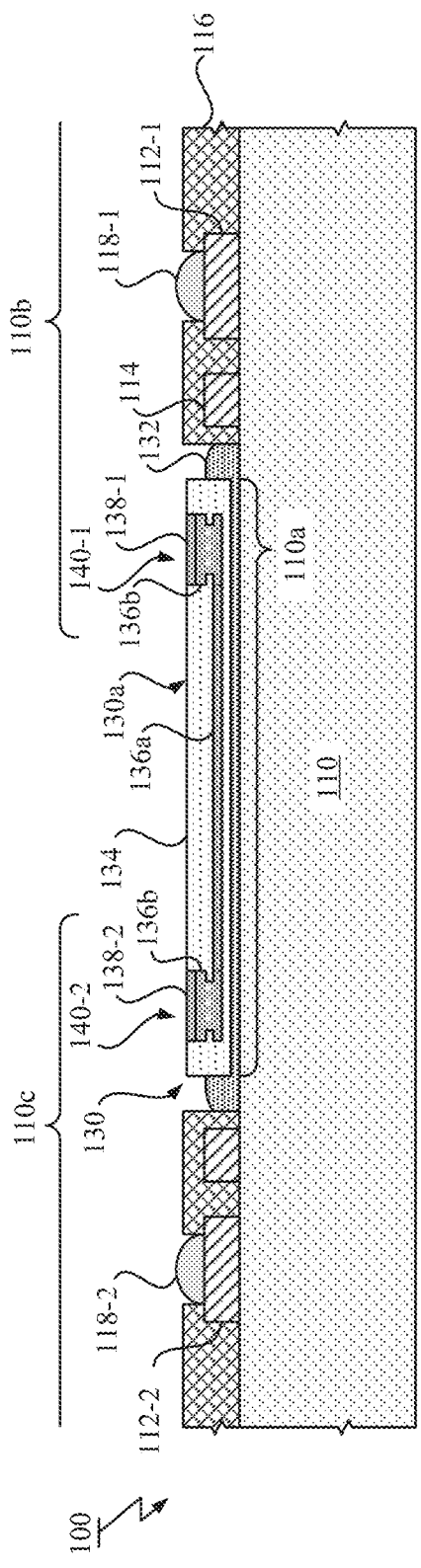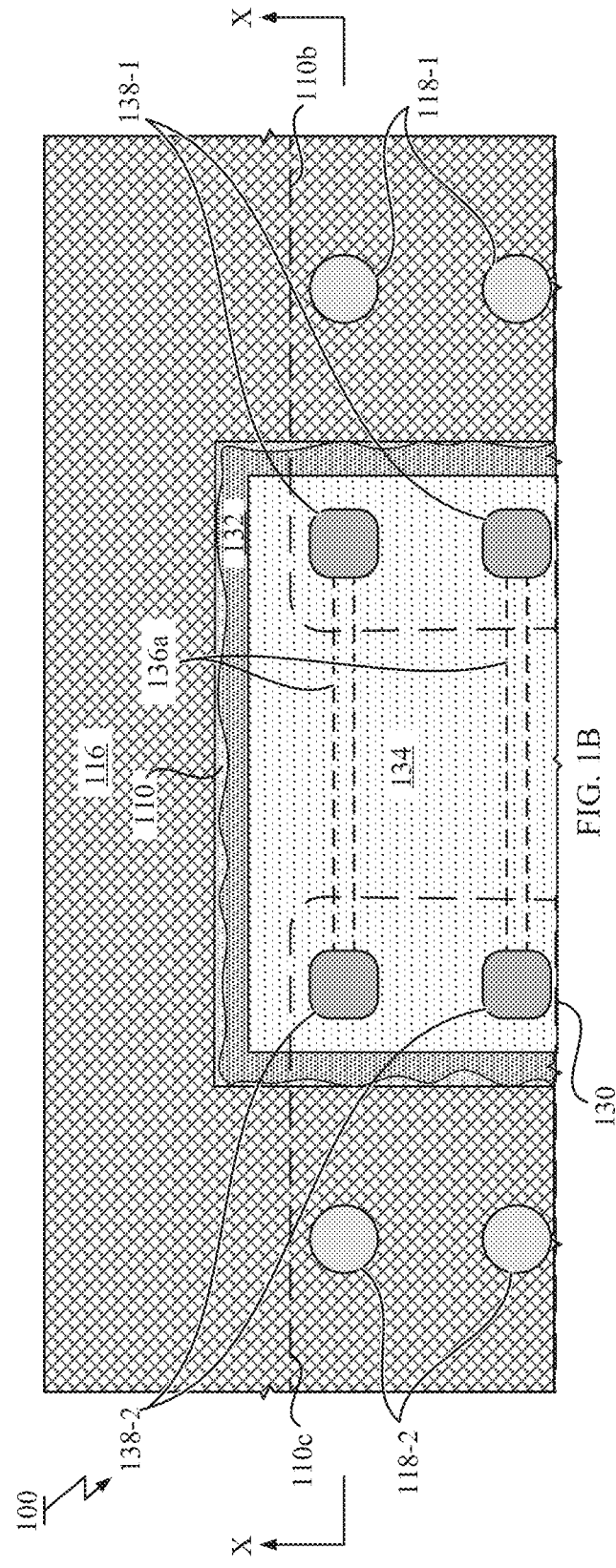
FIG. 1A
FIG. 1B

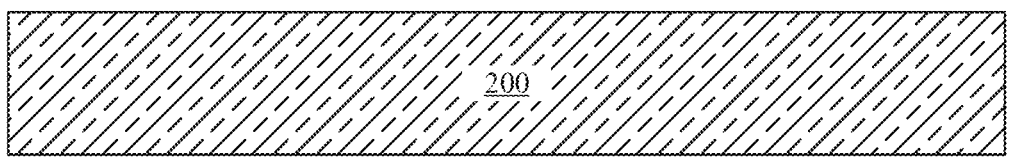
FIG. 11A
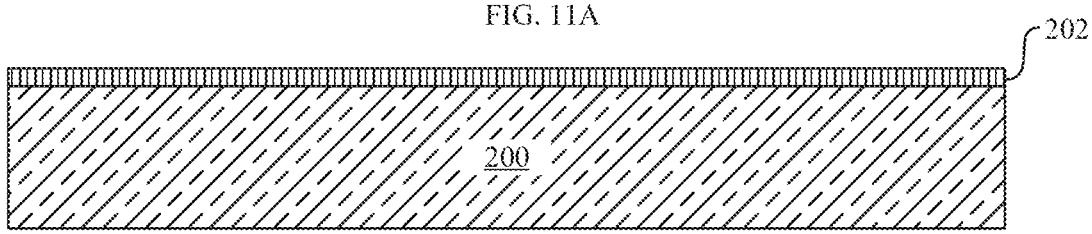
FIG. 11B
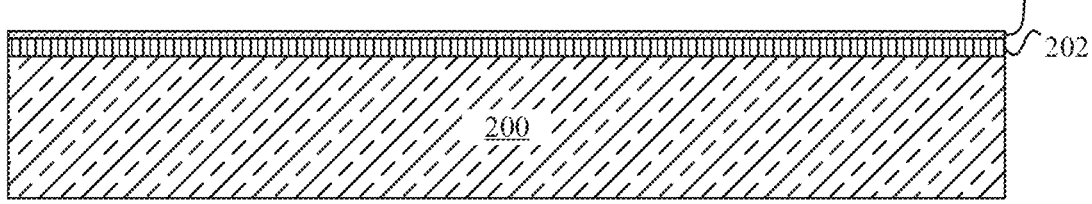
FIG. 11C
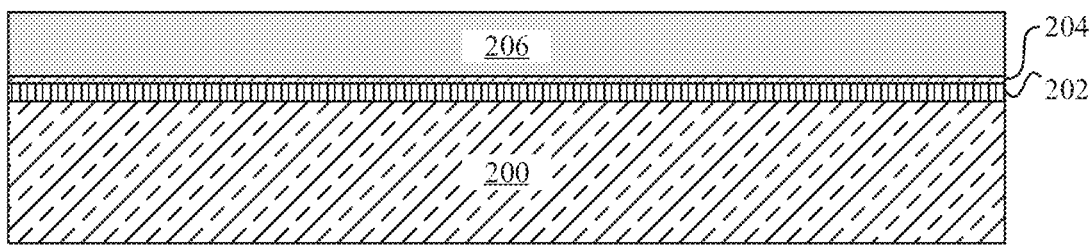
FIG. 11D
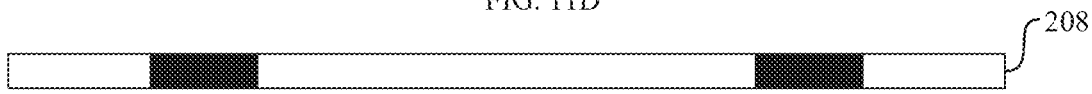
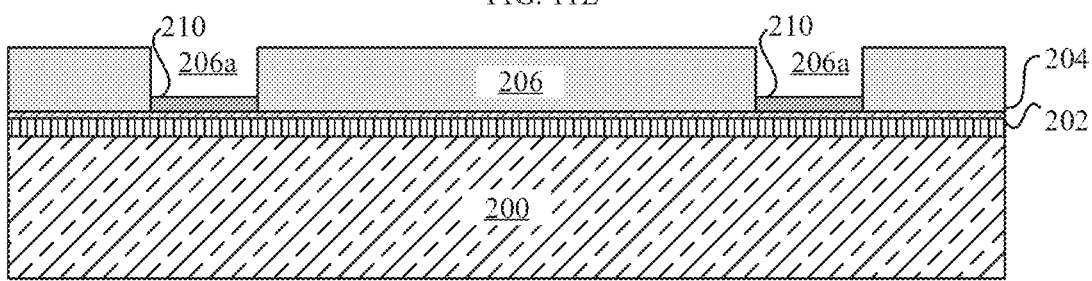
FIG. 11E
FIG. 11F

CONTROLLING OF HEIGHT OF HIGH-DENSITY INTERCONNECTION STRUCTURE ON SUBSTRATE

BACKGROUND

Technical Field

The present invention, generally, relates to interconnection technology, more particularly, to an interconnection layer carrying structure, a method of fabricating thereof, a method of using thereof and a related interconnection substrate used for interconnecting chips mounted thereon.

Description of the Related Art

In response to growing demand for wide band signal transmission between chips (or dice), several technologies targeting high density interconnections between chips have been proposed, including silicon interposer, EMIB (Embedded Multi-Die Interconnect Bridge) and iTHOP (integrated Thin film High density Organic Package).

The silicon interposer technology requires expensive BEOL (Back End Of Line) process to form high density circuitries on the silicon interposer and TSV (Through Silicon Via) fabrication process to connect metallization layers on its front and back surfaces. Also large insertion loss is caused by the TSV since the silicon into which the TSVs are fabricated is a semiconductor, not an insulator.

The EMIB (Embedded Multi-Die Interconnect Bridge) suffers from a problem of mechanical stress due to CTE (Coefficient for Thermal Expansion) mismatch between an organic substrate and a silicon bridge interconnect assembly embedded in the organic substrate, resulting in negative impacts on interconnection reliability and production yield.

The iTHOP requires expensive chemical mechanical polishing (CMP) process as well as delicate fabrication process to form high density interconnection layer over an organic buildup substrate. The organic substrate on which the interconnection layer is fabricated is generally unstable and warped substrate. Thus, production yield would be lowered.

Furthermore, it is preferable to control the height of the interconnection surface of the interconnection structure to which the chips are mounted in order to achieve reliable interconnections with the fine pitch.

Therefore, there is a need for a novel structure capable of achieving inexpensive, reliable high-density interconnections between chips to be mounted thereon while controlling the height of the interconnection structure on which the chips are to be mounted.

SUMMARY

According to an embodiment of the present invention, an interconnection layer carrying structure for transferring an interconnection layer onto a substrate is provided. The interconnection layer carrying structure includes a support substrate, a release layer on the support substrate and an interconnection layer on the release layer. The interconnection layer includes an organic insulating material and a set of pads embedded in the organic insulating material. The set of the pads is configured to face towards the support substrate. The support substrate has a base part where the interconnection layer is formed and an extended part extending outside the base part.

When using the interconnection layer carrying structure according to the embodiment of the present invention to transfer the interconnection layer onto the substrate, the extended part of the support substrate can be used as a guide for leveling the interconnection layer to the substrate. Therefore, the interconnections provided by the interconnection layer transferred onto the substrate would present a high reliability with the fine pitch.

In a preferable embodiment, the substrate has a first planar surface and the extended part of the support substrate has a second planar surface that is configured to be approximately parallel to the first planar surface of the substrate by way of abutment of the extended part when transferring the interconnection layer onto the substrate from the support substrate. Thereby, leveling of the interconnection layer to the substrate can be easily performed.

In a particular embodiment, the substrate includes a solder resist layer having the first planar surface. The second planar surface of the extended part is configured to abut against the first planar surface of the solder resist layer directly or indirectly via the release layer when transferring the interconnection layer. Thereby, the internal stress of the interconnection layer during the transfer can be reduced since the extended part holds the first planar surface of the solder resist layer.

In other particular embodiment, the substrate includes a solder resist layer having the first planar surface on which a spacer having a third planar surface is placed before transferring the interconnection layer. The second planar surface of the extended part is configured to abut against the third planar surface of the spacer directly or indirectly via the release layer so that the second planar surface becomes approximately parallel to the first planar surface when transferring the interconnection layer. Thereby, the internal stress of the interconnection layer during the transfer can be reduced since the extended part holds the third planar surface of the spacer.

According to other embodiment of the present invention, a method for fabricating an interconnection layer carrying structure that is used for transferring an interconnection layer onto a substrate is provided. The method includes preparing a support substrate; applying a release layer onto the support substrate; building a set of pads on the release layer; and forming an organic insulating material layer over the set of the pads. The organic insulating material layer is formed within a predefined area of the support substrate such that the support substrate has a base part corresponding to the predefined area and an extended part extending outside the base part.

When using the interconnection layer carrying structure fabricated by the method according to the embodiment of the present invention to transfer the interconnection layer onto the substrate, the extended part can be used as a guide for leveling the interconnection layer to the substrate. Therefore, the interconnections provided by the interconnection layer transferred onto the substrate would present a high reliability with the fine pitch.

According to further other embodiment of the present invention, a method for fabricating an interconnection substrate used for interconnecting chips mounted thereon using an interconnection layer carrying structure is provided. The interconnection layer carrying structure includes an interconnection layer, a release layer on the interconnection layer and a support substrate on the release layer. The interconnection layer includes an organic insulating material and a set of pads embedded in the organic insulating material, in which the set of the pads is configured to face towards the support substrate. The support substrate has a base part where the interconnection layer is formed and an extended part extending outside the base part. The method includes preparing a base substrate provided with a first group of electrodes for a first chip and a second group of electrodes for a second chip thereon. The method also includes placing the interconnection layer carrying structure onto the base substrate by leveraging the extended part of the support substrate, in which the interconnection layer of the interconnection layer carrying structure is placed in a defined area on the base substrate between the first group and the second group of the electrodes.

The interconnection substrate fabricated by the method according to the embodiment of the present invention can provide an improved reliability for fine pitch interconnections with the chips mounted thereon since the height of the interconnection surface of the interconnection layer is finely leveled to the base substrate.

In a preferable embodiment, the base substrate has a first planar surface and the extended part of the support substrate has a second planar surface. Placing the interconnection layer carrying structure includes leveling the second planar surface of the extended part by way of abutment of the extended part such that the second planar surface becomes approximately parallel to the first planar surface. Thereby, leveling of the pads of the interconnection layer to the substrate can be easily performed.

In a particular embodiment, the base substrate includes a solder resist layer having the first planar surface. Leveling the second planar surface of the extended part includes making the second planar surface of the extended part of the support substrate abut against the first planar surface of the solder resist layer directly or indirectly via the release layer. Thereby, the internal stress of the interconnection layer during the transfer can be reduced since the extended part holds the first planar surface of the solder resist layer.

In other particular embodiment, the base substrate includes a solder resist layer having the first planar surface. Leveling the second planar surface of the extended part includes placing a spacer having a third planar surface onto the solder resist layer; and making the second planar surface of the extended part of the support substrate abut against the third planar surface of the spacer directly or indirectly via the release layer so that the second planar surface becomes approximately parallel to the first planar surface. Thereby, the internal stress of the interconnection layer during the transfer can be reduced since the extended part holds the third planar surface of the spacer.

According to another embodiment of the present invention, an interconnection substrate for interconnecting chips is provided. The interconnection substrate includes a base substrate; a first group of electrodes on the base substrate for a first chip to be mounted; a second group of electrodes on the base substrate for a second chip to be mounted; and an interconnection layer located within a defined area on the base substrate between the first group and the second group of the electrodes. The interconnection layer is provided by placing an interconnection layer carrying structure onto the base substrate. The interconnection layer carrying structure includes a layer corresponding to the interconnection layer, a release layer on the layer and a support substrate on the release layer. The layer includes a set of pads for the first chip and the second chip and an organic insulating material. The set of the pads is embedded in organic insulating material. The support substrate has a base part where the interconnection layer is formed and an extended part extending outside the base part.

The interconnection substrate according to the embodiment of the present invention can provide an improved reliability for fine pitch interconnection with the chips mounted thereon since the height of the interconnection surface of the interconnection layer are finely leveled to the base substrate.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings. Note that the sizes and relative positions of elements and layers in the drawings are not necessarily drawn to scale. Some of these elements or layers are arbitrarily enlarged and positioned for improving legibility of drawing.

FIG. 1A illustrates a cross section view schematic of an interconnection substrate along line X-X as shown in FIG. 1B according to an embodiment of the present invention.

FIG. 1B illustrates a top view schematic of an interconnection substrate according to an embodiment of the present invention

FIGS.

FIG. 11A illustrates a cross-sectional view of a support substrate an a carrying structure for an interconnection layer according to an embodiment of the present invention.

FIG. 11B illustrates a cross-sectional view of a release layer formed on the carrying structure of FIG. 11A according to an embodiment of the present invention.

FIG. 11C illustrates a cross-sectional view of a first seed metal layer formed on the carrying structure of FIG. 11B according to an embodiment of the present invention.

FIG. 11D illustrates a cross-sectional view of plating resist formed on the carrying structure of FIG. 11C according to an embodiment of the present invention.

FIG. 11E illustrates a cross-sectional view of a photomask for processing the carrying structure of FIG. 11D according to an embodiment of the present invention.

FIG. 11F illustrates a cross-sectional view of the carrying structure of FIG. 11E with openings having metal stacks according to an embodiment of the present invention.

DETAILED DESCRIPTION

Figure 2:
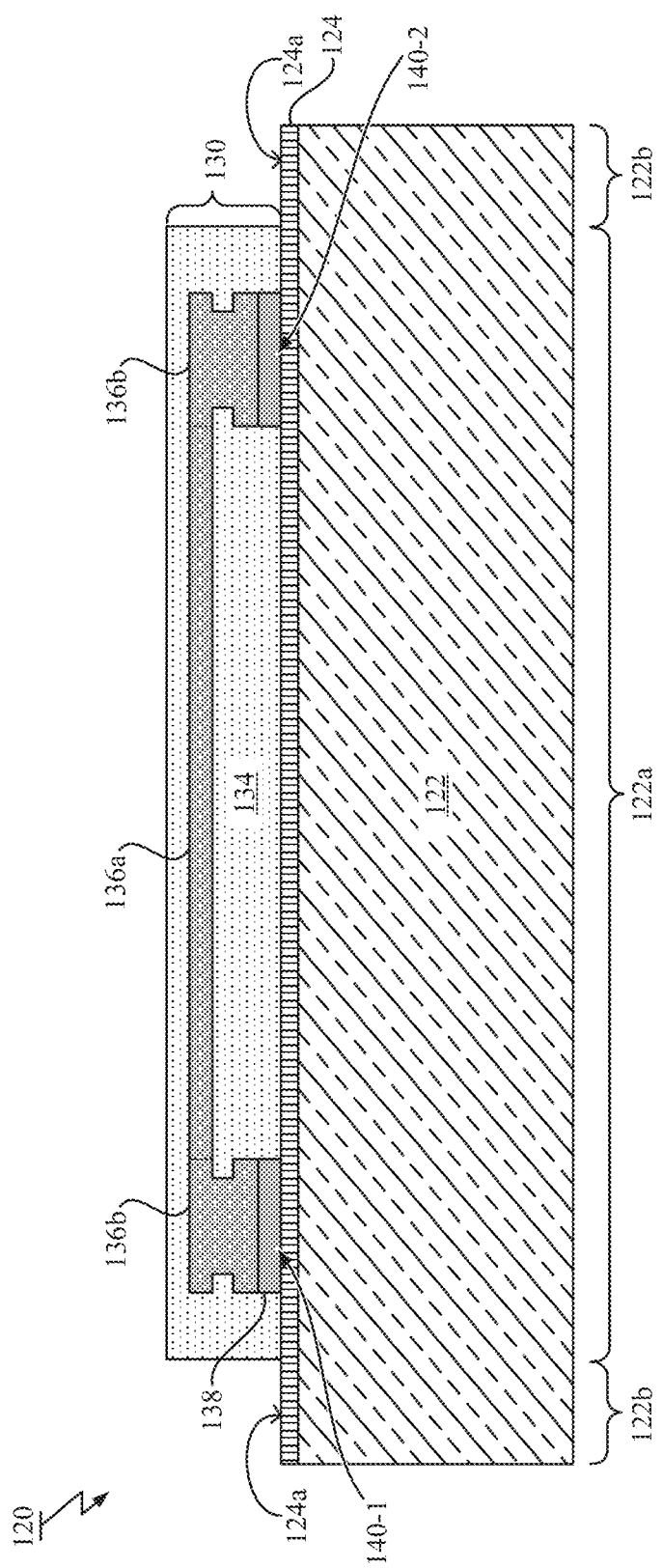
FIG. 2 illustrates a schematic of an interconnection layer carrying structure that can be used for transferring an interconnection layer onto a target substrate according to an exemplary embodiment of the present invention.

Hereinafter, the present invention will be described with respect to particular embodiments, but it will be understood by those skilled in the art that the embodiments described below are mentioned only by way of examples and are not intended to limit the scope of the present invention.

One or more embodiments according to the present invention are directed to an interconnection layer carrying structure, a method of fabricating the interconnection layer carrying structure, a method of using the interconnection layer carrying structure and a related interconnection substrate used for interconnecting chips mounted thereon, in which high density interconnections between chips can be achieved in a novel manner.

Hereinafter, referring to FIGS. 1A, 1B, a schematic of an interconnection substrate according to an exemplary embodiment of the present invention is described.

FIGS. 1A, 1B illustrate a schematic of an interconnection substrate 100 for interconnecting chips to be mounted thereon. FIG. 1A shows a cross-sectional view of the interconnection substrate 100 and FIG. 1B shows a top view of the interconnection substrate 100. Note that the cross-sectional view shown in FIG. 1A corresponds to a cross-section indicated by "X" in the top view of FIG. 1B.

As shown in FIG. 1A, the interconnection substrate 100 includes an organic base substrate 110; a plurality of electrodes 112 formed on the top surface of the organic base substrate 110; and an interconnection layer 130 disposed on the organic base substrate 110.

The organic base substrate 110 may be a build-up substrate having an appropriate number of wring layers and interlayer dielectrics, which may be fabricated by any standard build-up process. The plurality of the electrodes 112 on the organic base substrate 110 may be an outermost layer of the build-up substrate. The organic base substrate 110 may also have an alignment mark 114 on the top surface thereof. Note that the internal layer structure in the organic base substrate 110 is omitted from the drawings for the purpose of illustration.

In a particular embodiment, the interconnection substrate 100 also includes a solder resist layer 116 formed on the organic base substrate 110. Each electrode 112 may be covered by the solder resist layer 116 and exposed from the solder resist layer 116 through an opening that is formed in the solder resist layer 116. Each electrode 112 may have a pre-solder 118 formed in the opening of the solder resist layer 116. The thickness of the electrode 112 may typically range from several micrometers to ten and several micrometers. The thickness of the solder resist layer 116 may be in the range of its adequate film thickness and may typically range from 10 micrometers to 40 micrometers.

The plurality of the electrodes 112 may include one group of electrodes (hereinafter, referred to as a first group) 112-1 that are positioned at a flip-chip area 110*b* on the interconnection substrate 100. The plurality of the electrodes 112 may also include other group of electrodes (hereinafter, referred to as a second group) 112-2 that are positioned at a different flip-chip area 110*c* on the interconnection substrate 100. The second group of the electrodes 112-2 may be located at a distance from the first group of the electrodes 112-1. Note that the pre-solders 118-1, 118-2 formed on the electrodes 112-1, 112-2 are depicted in the top view of FIG. 1B. The flip-chip area 110*b* is an area where one chip (hereinafter, referred to as a first chip) would be mounted in a subsequent chip mounting process. The flip-chip area 110*c* is an area where other chip (hereinafter, referred to a second chip) would be mounted in the subsequent chip mounting process.

The interconnection layer 130 is disposed on the top surface of the organic base substrate 110 and located within a defined area 110*a* between the first group of the electrodes 112-1 and the second group of the electrodes 112-2. The defined area 110*a* where the interconnection layer 130 is disposed has no solder resist. The interconnection layer 130 may be precisely positioned at the defined area 110*a* by using the alignment mark 114 and attached to the organic base substrate 110. Note that the defined area 110*a* for the interconnection layer 130 overlaps with both of the flip-chip areas 110*b*, 110*c*, partially.

The interconnection layer 130 is bonded to the top surface of the organic base substrate 110 by an adhesive 132. In the described embodiment, the adhesive 132 protrudes outward from a gap sandwiched between the interconnection layer 130 and the organic base substrate 110 as shown in FIGS. 1A and 1B.

Further referring to FIG. 1A, a more detailed structure of the interconnection layer 130 is also depicted. The interconnection layer 130 includes an organic insulating material 134; a conductive pattern 136 embedded in the organic insulating material 134; and a plurality of pads 140 exposed at the top surface 130*a* of the interconnection layer 130. In a particular embodiment, the organic insulating material 134 may give the top surface 130*a* of the interconnection layer 130.

The conductive pattern 136 may include a plurality of trace 136*a* and a plurality of pad parts 136*b*, each of which constitutes a pad 140. Each pad 140 may be made up of the pad part 136*b* of the conductive pattern 136 and a metal stack 138 formed on the pad part 136*b*.

The plurality of the pads 140 includes one set of pads (hereinafter, referred to as a first set) 140-1 that are positioned at the flip-chip area 110*b* and other set of pads (hereinafter, referred to as a second set) 140-2 that are positioned at the different flip-chip area 110*c*. Note that the metal stacks 138-1, 138-2 of the pads 140-1, 140-2 are depicted in the top view of FIG. 1B. Also note that edges of the trace 136*a* formed in the organic insulating material 134 are indicated by dashed lines in the top view of FIG. 1B. As shown in FIG. 1A, a corresponding pad 140-1 in the first set and a corresponding pad 140-2 in the second set are electrically coupled by a corresponding trace 136*a*.

Since the top view of FIG. 1B shows a part of the interconnection substrate 100, there are merely two pads 140 and two electrodes 112 for each chip in FIG. 1B. However, the number of the pads 140 and the number of the electrodes 112 for each chip depends on the specification of the chip. Generally, one or more electrodes for each chip may be placed on the organic base substrate 110 and one or more pads for each chip may be formed in the interconnection layer 130.

As described later, the first set of the pads 140-1 and the first group of the electrodes 112-1 together are configured to receive bumps of the first chip. The second set of the pads 140-2 and the second group of the electrodes 112-2 together are configured to receive bumps of the second chip.

In the described embodiment, the interconnection layer 130 shown in FIG. 1 can be attached onto the organic base substrate 110 by using a novel interconnection layer carrying structure. Hereinafter, referring to FIG. 2, an interconnection layer carrying structure 120 used for transferring an interconnection layer onto a target substrate is described.

FIG. 2 illustrates a schematic of an interconnection layer carrying structure that can be used for transferring the interconnection layer 130 onto the organic base substrate 110 in order to fabricate the interconnection substrate 100 shown in FIGS. 1A and 1B. The view shown in FIG. 2 is a cross-sectional view of the interconnection layer carrying structure 120.

As shown in FIG. 2, the interconnection layer carrying structure 120 includes a support substrate 122; a release layer 124 on the support substrate 122; and an interconnection layer 130 on the release layer 124. Note that the interconnection layer 130 shown in FIG. 2 is illustrated with facing upside down with respect to the view shown in FIG. 1A.

The support substrate 122 is a rigid and stable substrate used to fabricate the interconnection layer 130 thereon. The support substrate 122 is suitably any substrate as long as it provides adequate rigidity and stability. In one or more embodiments, the support substrate 122 may be an inorganic substrate including glass, semiconductor, ceramic, etc. In a preferable embodiment, the support substrate 122 is a glass substrate since the glass substrate has transparency and thermal expansion coefficient (CTE) (3~12 ppm/degrees Celsius) closer to that of organic material used to build the interconnection layer 130 in comparison with silicon substrate, for example. Such glass substrate may include soda lime glass, borosilicate glass, fused silica, synthetic quartz glass, to name but a few.

The release layer 124 is a release coating configured to release the interconnection layer 130 from the support substrate 122 by appropriate treatment. When the support substrate 122 has transparency, UV (ultraviolet)/IR (infrared)/visible light can be irradiated to the release layer 124 from the back side of the support substrate 122 to release the interconnection layer 130 from the support substrate 122.

In one or more embodiments, the release layer 124 may be any known light sensitive release layer that allows de-bonding from the support substrate interface with laser illumination in the field of wafer bonding/de-bonding technology. In a particular embodiment, a light-to-heat conversion release coating, which converts absorbed light energy to heat, may be used as the release layer 124. In other particular embodiment, a UV ablation layer that is highly absorptive in the ultraviolet spectrum may be used as the release layer 124. In these particular embodiments, the release layer 124 may be burned, broken down or decomposed by ablating the release layer 124 using laser illumination so as to release the interconnection layer 130 from the support substrate 122 after the interconnection layer 130 is fixed to the organic base substrate 110.

In other embodiments, the release layer 124 may be a thermal or UV-releasable adhesive layer whose adhesive property disappears or degrades by heat or UV irradiation. Residual of the release layer 124 can be cleaned after releasing if necessary. In further other embodiments, any of the known de-bonding methods including mechanical peel-off method, thermal slide-off method and solvent release method can be adopted.

As described with referring to FIG. 1A, the interconnection layer 130 includes the organic insulating material 134; the plurality of the pads 140 that is configured to face towards the support substrate 122 and embedded in the organic insulating material 134; the plurality of the traces 136a embedded in the organic insulating material 134.

The plurality of the pads 140 includes the first set of the pads 140-1 and the second set of the pads 140-2, in which each corresponding pair of the pad 140-1 and the pad 140-2 is coupled by corresponding one of the traces 136a. The organic insulating material 134 may be disposed on the release layer 124. The top surface of the organic insulating material 134 may be flat and bare surface. The pads 140 may be exposed at a bottom surface from the organic insulating material 134 and in contact with the release layer 124 at the bottom surface of the organic insulating material 134. In the described embodiment, each pad 140 includes the metal stack 138 formed on the release layer 124. Each pad 140 may further include a seed metal layer, which may be used to deposit conductive material (e.g., the metal stack 138) on the release layer 124 by electrolytic plating.

The organic insulating material 134 may be any one of photosensitive insulating resins such as PI (polyimide), BCB (benzocyclobutene), polybenzoxazole (PBO), or other photosensitive polymers. The conductive pattern 136, including the trace 136a and the pad parts 136b, may be made of any one of metal materials (e.g., Cu, Al, etc.) and other conductive materials. In a particular embodiment, metal copper may be used for the conductive pattern 136. The metal stack 138 may be, but not limited to, an Au/Pd/Ni stack, that is worked as a metallurgy on the side of the organic base substrate 110 to which the bumps of the chip are joined.

In the described embodiment, the interconnection layer 130 is formed within a predefined area on the support substrate 122 such that the support substrate 122 has a base part 122a on which the interconnection layer 130 is fabricated and extended parts 122b of both edges extending outside the base part 122a. The extended parts 122b of the support substrate 122 have planar surfaces configured to be approximately parallel to a planar surface of the organic base substrate 110 by way of abutment of the extended part 122b when transferring the interconnection layer 130 onto the organic base substrate 110 from the support substrate 122. As shown in FIG. 1, the organic base substrate 110 may have the solder resist layer 116 that has the planar surface for the abutment. In a particular embodiment, the planar surfaces of the extended parts 122b of the support substrate 122 are configured to abut against the planar surface of the solder resist layer 116 of the organic base substrate 110 directly or indirectly via the release layer 124 when transferring the interconnection layer 130.

In the described embodiment, the planar surfaces of the extended parts 122b are provided as the top surface 124a of the release layer 124. However, it is not necessary that the release layer 124 extends to the areas of the extended parts 122b of the support substrate 122. In other embodiment, the extended parts 122b of the support substrate 122 provide directly planar surfaces configured to be approximately parallel to the planar surface of the solder resist layer 116.

As shown in FIG. 2, the interconnection layer 130 is provided as being fabricated on the support substrate 122 in a form of tape that is formed by organic material and held by the support substrate 122 as a rigid backing material that has a width larger than the width of the interconnection layer 130. A process to fabricate the interconnection layer carrying structure 120 will be described later.

Hereinafter, referring to FIGS. 3A-3B and FIGS. 4A-4C, a process for fabricating an interconnection substrate by using an interconnection layer carrying structure according to an exemplary embodiment of the present invention is described. FIGS. 3A-3B and FIGS. 4A-4C illustrate cross-sectional views of structure being obtained at each step of the fabrication process of the interconnection substrate 100.

Figure 3A:
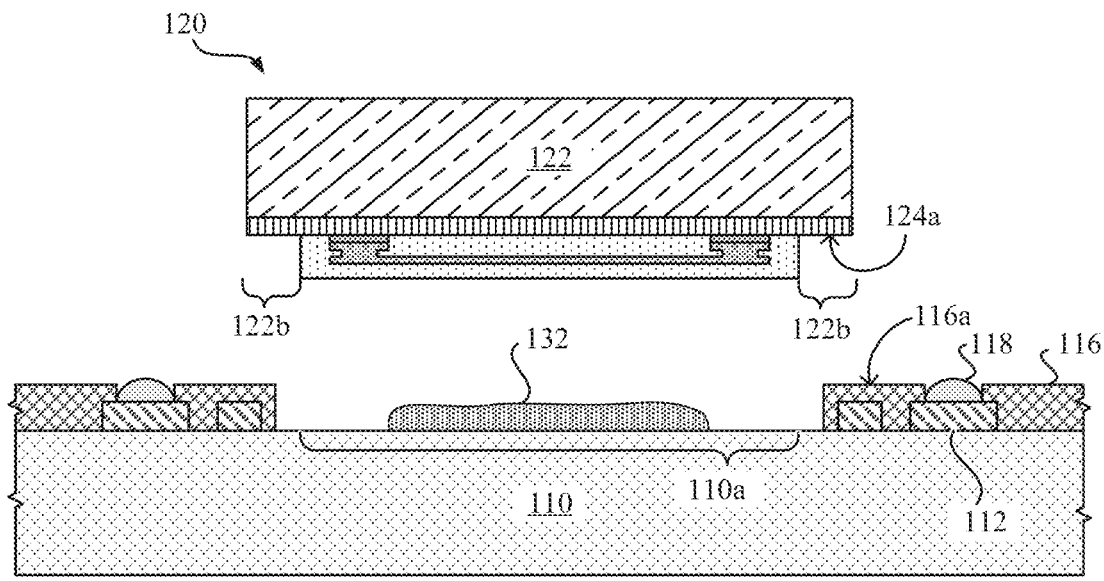
FIG. 3A illustrates a cross-sectional view of the structure before the interconnection layer is attached to the interconnection substrate according to an embodiment of the present invention.

As shown in FIG. 3A, the fabrication process may include a step of preparing the organic base substrate 110 and the interconnection layer carrying structure 120. The organic base substrate 110 prepared by this step may be provided with the plurality of the electrodes 112 having the pre-solder 118 and the solder resist layer 116 formed thereon. Note that there is a defined area 110a on the organic base substrate 110 where no solder resist is present. Furthermore, the solder resist layer 116 has a top planar surface 116a, which the planar surfaces 124a of the extended parts 122b are configured to abut against.

As shown in FIG. 3A, the fabrication process may further include a step of applying an adhesive 132 onto the organic base substrate 110 within the defined area 110a. The material used as the adhesive 132 in this fabrication process may be a paste or liquid type adhesive, which may have been conventionally used as an underfill when bonding chips with substrates. Use of the paste or liquid type adhesive makes it possible to prevent the occurrence of voids in the adhesive 132.

Figure 3B:
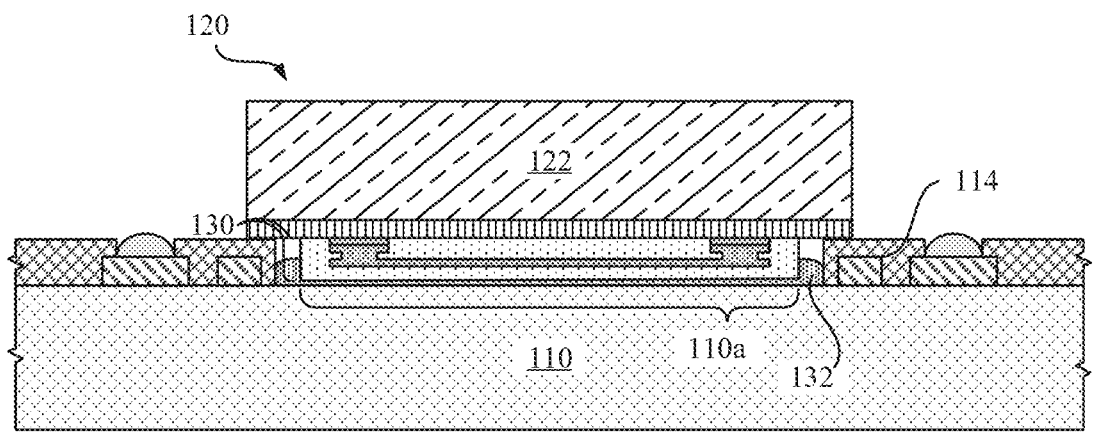
FIG. 3B illustrates a cross-sectional view of the structure after the interconnection layer is attached to the interconnection substrate according to an embodiment of the present invention.

As shown in FIG. 3B, the fabrication process may include a step of placing the interconnection layer carrying structure 120 onto the organic base substrate 110 by leveraging the extended parts 122b of the support substrate 122. Note that the step of the applying the adhesive 132 may be performed prior to the placement of the interconnection layer carrying structure 120 onto the organic base substrate 110. The interconnection layer carrying structure 120 may be placed onto the organic base substrate 110 by using a bonder in a upside down manner such that the pads 140 faces up and the bare surface of the organic insulating material 134 face down. The bottom of the organic insulating material 134 is attached to the top surface of the organic base substrate 110 within the defined area 110a, while the adhesive 132 protruding outward from a gap sandwiched between the organic insulating material 134 of the interconnection layer 130 and the organic base substrate 110.

The step of placing the interconnection layer carrying structure 120 onto the organic base substrate 110 may include a sub-step of leveling the planar surfaces of the extended parts 122b by way of abutment of the extended part 122b such that the planar surfaces of the extended parts 122b become approximately parallel to the top planar surface 116a of the solder resist layer 116 of the organic base substrate 110. In the described embodiment, the sub-step of leveling of the planar surfaces 124a of the extended parts 122b is performed by making the planar surfaces 124a of the extended parts 122b of the support substrate 122 abut against the top planar surface 116a of the solder resist layer 116 of the organic base substrate 110.

Note that the dimensions (e.g. width) of the extended parts 122b of the support substrate 122 can be designed so that areas sufficient to abut against the planar surface of the solder resist layer 116 are obtained. Similarly, the solder resist layer 116 can be designed so that the top planar surface 116a has an area sufficient to abut against the planar surfaces 124a of the extended parts 122b of the support substrate 122 are obtained.

Since the pads 140 of the interconnection layer 130 and the electrodes 112 on the organic base substrate 110 are configured to receive bumps of chips to be mounted, the interconnection layer carrying structure 120 is positioned precisely at the defined area 110a by using the alignment mark 114 that may be formed on the organic base substrate 110 in advance. The fabrication process may further include a step of curing the adhesive 132 so as to firmly bond the interconnection layer 130 to the organic base substrate 110 after the step of placing the interconnection layer carrying structure 120 onto the organic base substrate 110.

Note that in the described embodiment, the step of the applying the adhesive 132 has been described to be performed prior to the placement of the interconnection layer carrying structure 120. However in other embodiment, the step of the applying the adhesive 132 may be performed posterior to the placement of the interconnection layer carrying structure 120 by way of capillary or injection flow method.

Figure 4A:
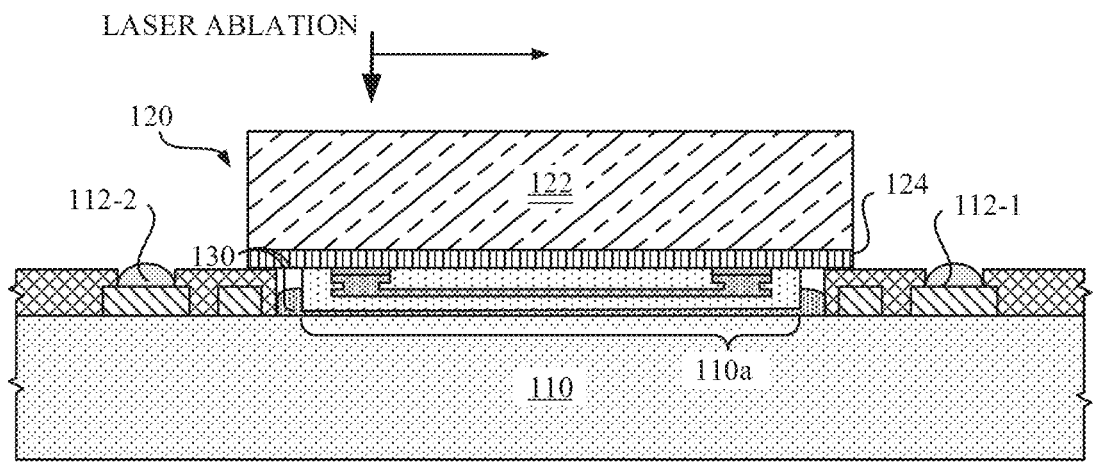
FIG. 4A illustrates a cross-sectional view of the interconnection layer being transferred to the interconnection substrate according to an embodiment of the present invention.

As shown in FIG. 4A, the fabrication process may include a step of releasing the interconnection layer 130 from the support substrate 122 by removing the release layer 124. In a particular embodiment, the support substrate 122 has transparency and the step of releasing from the support substrate 122 may be done by ablating the release layer 124 with laser illumination through the support substrate 122 while scanning the laser beam.

By performing aforementioned steps, the interconnection layer 130 can be attached to the organic base substrate 110 and precisely positioned at the defined area 110a between the first group of the electrodes 112-1 and the second group of the electrodes 112-2. The releasing step shown in FIG. 4A leaves the interconnection layer 130 on the organic base substrate 110 such that the set of the pads 140 faces in a direction opposite to the organic base substrate 110.

Figure 4B:
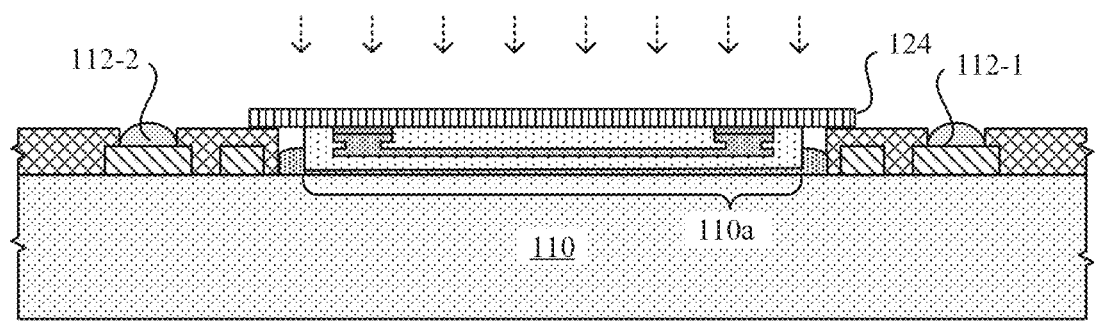
FIG. 4B illustrates a cross-sectional view of the interconnection layer having been applied to the interconnection substrate with a release layer removed according to an embodiment of the present invention.

As shown in FIG. 4B, the fabrication process may also include a step of performing cleaning of residuals on a top of the interconnection layer 130, which may include residuals of the release layer 124, after the step of removing the release layer 124. The cleaning of the residuals may be performed by virtually any standard means including $O_2$ plasma irradiation.

Figure 4C:
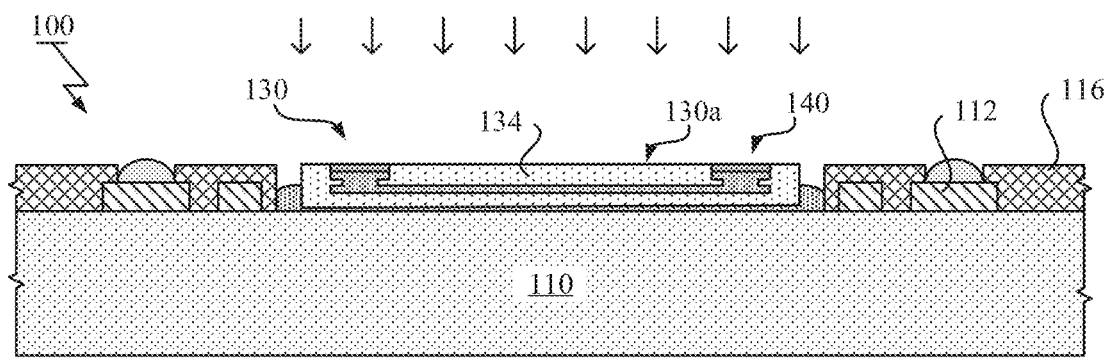
FIG. 4C illustrates a cross-sectional view of the interconnection layer applied to the interconnection substrate according to an embodiment of the present invention.

As shown in FIG. 4C, the fabrication process may also include a step of performing an etching of surfaces of the pads 140, which may include a seed metal layer formed on the pads 140, to expose the surface of the metal stack 138, after the step of removing the release layer 124.

After the etching step, each pad 140 may be exposed at the top surface 130a of the interconnection layer 130. The interconnection substrate 100 obtained by the fabrication process shown in FIGS. 3A-3B and FIGS. 4A-4C, which includes the organic base substrate 110, the plurality of the electrodes 112, the solder resist layer 116 and the interconnection layer 130, can be passed to a subsequent process such as chip mounting process.

In the exemplary embodiment, since the extended parts 122b of the support substrate 122 can be used as a guide for leveling the interconnection layer 130 to the organic base substrate 110 when transferring the interconnection layer 130, the height of the top surface 130a of the interconnection layer 130 (interconnection surface) can be finely leveled to the organic base substrate 110 (the top planar surface of the solder resist layer 116) even though the paste or liquid type adhesive are used. Therefore, the interconnections provided by the interconnection layer 130 that has been transferred onto the organic base substrate 110 would present a high reliability with the fine pitch.

Also, since leveling of the planar surfaces of the extended parts 122b is done by way of abutment of the extended parts 122b the step of leveling of the interconnection layer 130 to the organic base substrate 110 can be easily conducted. Furthermore, since the top planar surface 116a of the solder resist layer 116 holds the extended parts 122b of the support substrate 122 due to the abutment during the attachment, the load or force applied to the support substrate 120 can be accepted by the solder resist layer 116 not the interconnection layer 130 itself, thereby, relieving the internal stress of the interconnection layer 130 during the transfer.

There may be variation in height of the interconnection layer 130 and the solder resist layer 116 if there is no particular devisal. In contrast, according to the exemplary embodiment, the extended parts 122b enable to perform accurate positioning and minimize internal stress of the interconnection layer 130.

Hereinafter, referring to FIGS. 5A-5C, FIG. 6, FIGS. 7A-7C, an electronic device including the interconnection substrate and chips mounted thereon, and subsequent process after the fabrication process of the interconnection substrate 100 shown in FIGS. 3A-3B and FIGS. 4A-4C are described.

Figure 5A:
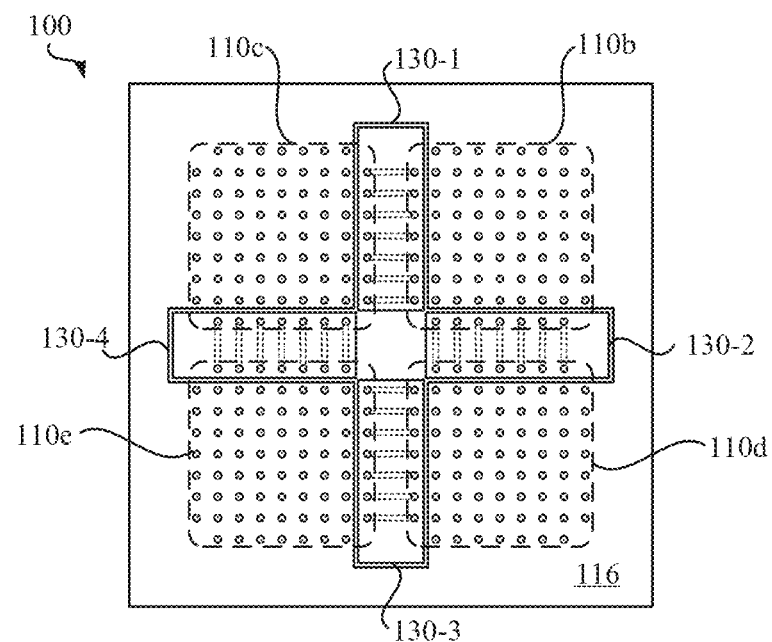
FIG. 5A illustrates a top view schematic of an electronic device including an interconnection substrate as an interposer before chip mounting according to an embodiment of the present invention.
Figure 5B:
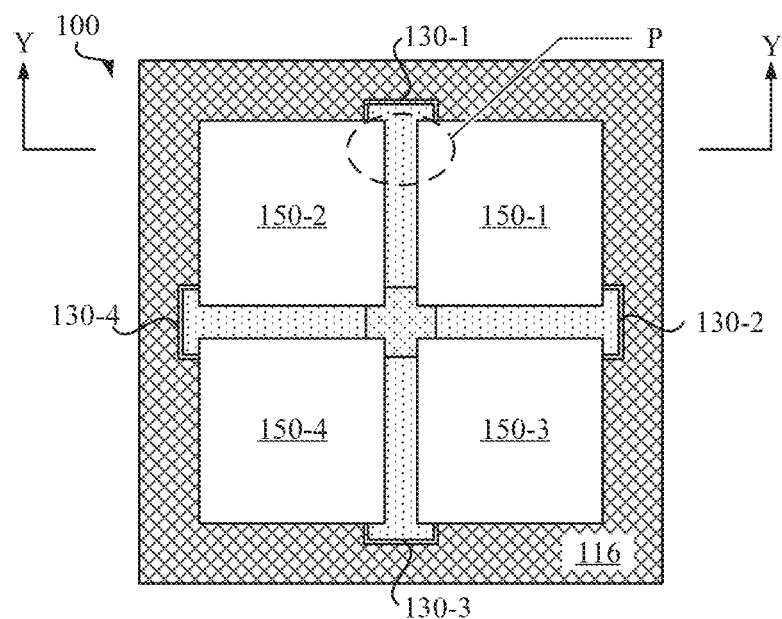
FIG. 5B illustrates a top view schematic of an electronic device including an interconnection substrate as an interposer after chip mounting according to an embodiment of the present invention.
Figure 5C:
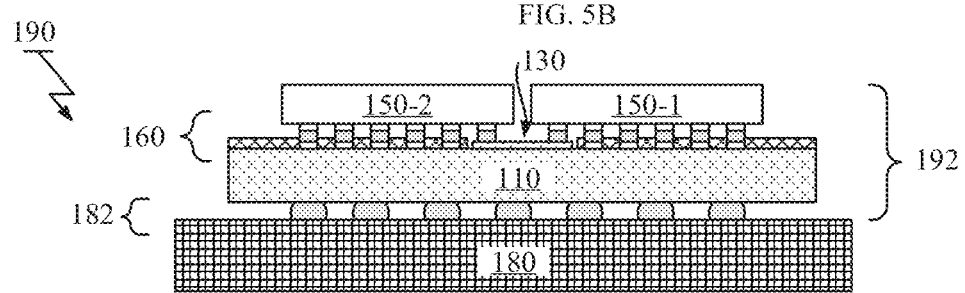
FIG. 5C illustrates a side view schematic of an electronic device along line Y-Y of FIG. 5B including an interconnection substrate as an interposer according to an embodiment of the present invention.

FIGS. 5A-5C illustrate a schematic of an electronic device 190 including an interconnection substrate 100 as an interposer. FIG. 5A shows a top view of an interconnection substrate 100 before chip mounting. FIG. 5B shows a top view of the interconnection substrate 100 after chip mounting. FIG. 5C shows a schematic of a novel package structure for the electronic device 190 with the interconnection substrate 100.

In the interconnection substrate 100 shown in FIG. 5A, there are four flip-chip areas 110b~110e for four chips 150-1~150-4, respectively. Also there are four interconnection layers 130-1~130-4, each of which is located in a corresponding defined area between any two adjacent flip-chip areas.

For example, the first interconnection layer 130-1 is located in a defined area between two flip-chip areas 110b, 110c for the chips 150-1, 150-2. For example, the second interconnection layer 130-2 is located in a defined area between two flip-chip areas 110b, 110d for the chips 150-1, 150-3. Note that the second interconnection layer 130-2 is depicted as being separated from the first interconnection layer in FIG. 5A. However, in other embodiment, the second interconnection layer 130-2 may be formed as a part of the first interconnection layer 130-1. The same may hold for other interconnection layers 130-3, 130-4.

In FIG. 5A, positions of the pads 140 of the interconnection layers 130-1~130-4 and positions of the electrodes 112 on the organic base substrate 110 are indicated by gray circles. Also, edges of the traces formed in the interconnection layers 130-1~130-4 are indicated by dashed lines.

As shown in FIG. 5A, the first set of the pads of the first interconnection layers 130-1 and the first group of the electrodes in the first flip-chip area 110b forms a two-dimensional (2D) array on which an array of bumps of the first chip 150-1 is mounted. The second set of the pads of the first interconnection layers 130-1 and the second group of the electrodes in the second flip-chip area 110c forms a 2D array on which an array of bumps of the second chip 150-2 is mounted. The same may hold for other combinations of adjacent chips (150-1&150-3, 150-2&150-4, 150-3&150-4).

Note that the pitch between pads and/or electrodes and the sizes of the pads and the electrodes are depicted as being identical over the entire flip-chip area 110b. However, the pitch and the sizes may be designed depending on the pitch between bumps and the size of the bumps of the chip 150 according to its specification. The chip may have a single pitch and single size bumps or may have mixed pitch and/or mixed size bumps depending on their specification. For example, fine pitch Cu pillar bumps can be used for ultra-high density signal connections between chips while coarse pitch micro-bumps are used for power and ground connections.

As shown in FIG. 5B, there are four chips 150-1~150-4 mounted on the interconnection substrate 100. The first chip 150-1 and the adjacent second chip 150-2 can perform signal transmission each other through the first interconnection layer 130 that is located between the first and second chips 150-1, 150-2. The same may hold for other combinations of adjacent chips (150-1&150-3, 150-2&150-4, 150-3&150-4).

Figure 6:
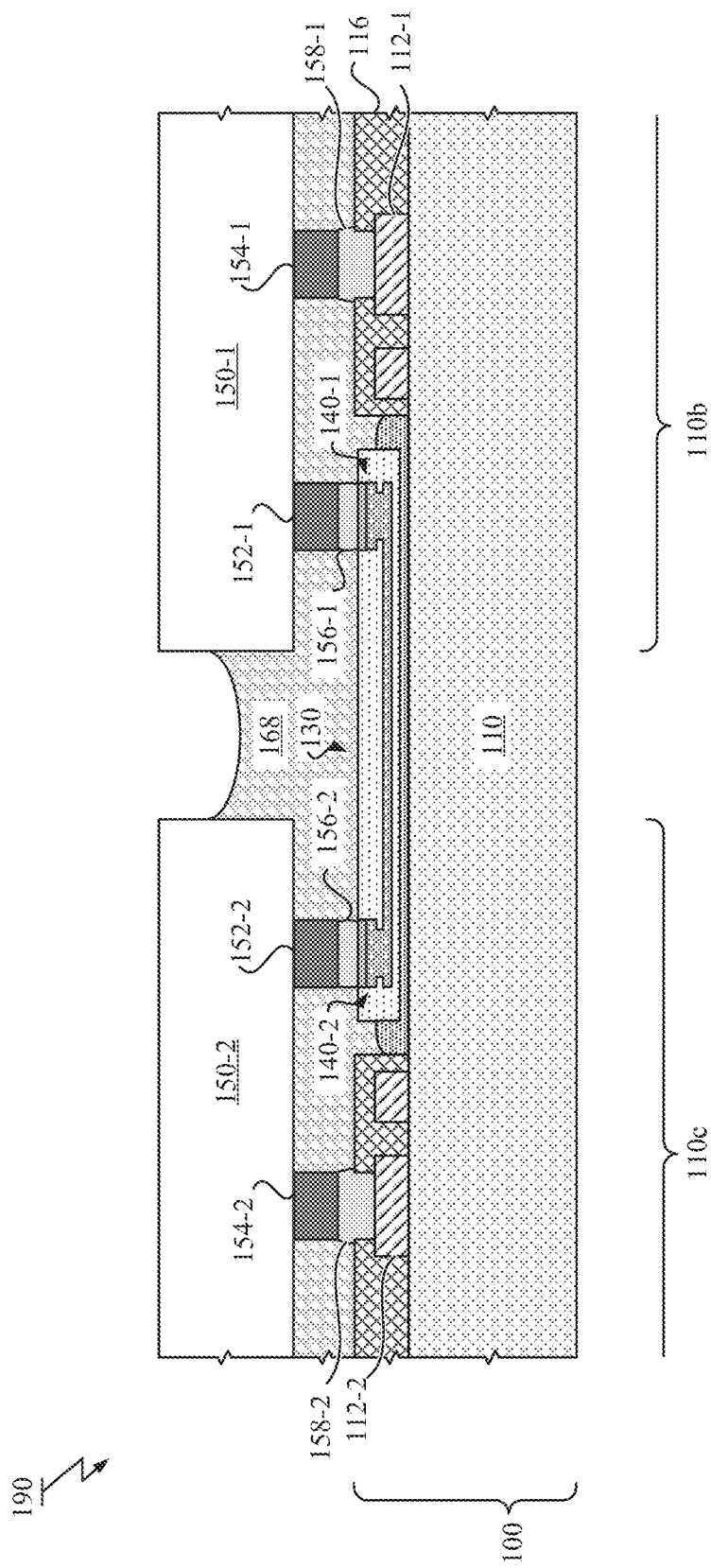
FIG. 6 illustrates a cross-sectional view of the electronic device around an interconnection layer according to the exemplary embodiment of the present invention.

FIG. 6 shows a cross-sectional view of the electronic device 190. Note that the cross-sectional view shown in FIG. 6 corresponds to an enlarged view of a portion indicated by a dashed circle "P" along with a cross-section indicated by "Y" in the top view of FIG. 5B.

As shown in FIG. 6, the electronic device 190 includes the aforementioned interconnection substrate 100; and the first and second chips 150-1, 150-2 mounted on the interconnection substrate 100 with facing down. Each chip 150 may be located at a position corresponding to the flip-chip area 110b/110c on the interconnection substrate 100. The gap between the interconnection substrate 100 and the chips 150-1, 150-2 may be filled by an underfill 168, which may be made of epoxies or urethanes. The gap height between the interconnection substrate 100 and the chips 150-1, 150-2 may depend on the bump height. In one embodiment, the gap height may be, but not limited to, several tens of micrometers.

The first group of the electrodes 112-1 and the first set of the pads 140-1 are positioned within the first flip-chip area 110b where the first chip 150-1 is mounted. The second group of the electrodes 112-2 and the second set of the pads 140-2 are positioned within the second flip-chip area 110c where the second chip 150-2 is mounted.

The first chip 150-1 has a set of peripheral bump's pillars 152-1 electrically connected to the first set of the pads 140-1 of the interconnection layer 130 through a solder 156-1. The first chip 150-1 has also a set of other bump's pillars 154-1 electrically connected to the first group of the electrodes 112-1 on the organic base substrate 110 through a solder 158-1. Although not shown in FIG. 6, the first chip 150-1 may have one or more sets of other peripheral bump's pillars for electrically interconnecting with one or more other chips, respectively. The second chip 150-2 has a set of peripheral bump's pillars 152-2 electrically connected to the second set of the pads 140-2 through a solder 156-2 and a set of other bump's pillars 154-2 electrically connected to the second group of the electrodes 112-2 through a solder 158-2.

With reference to FIG. 5C, a schematic of a novel package structure for the electronic device 190 with the interconnection substrate 100 is depicted. Even though the package structure shown in FIG. 5C may be referred to as a multi-chip package; however, the novel package structure provides functionality equivalent to 2.5 D integration, which generally requires an expensive member such as a silicon interposer with BEOL and TSV.

As shown in FIG. 5C, a plurality of chips (150-1, 150-2 in FIG. 5C) are mounted on the interconnection substrate 100 through flip-chip interconnections 160 between bumps of the chips 150 and electrodes and pads formed on the interconnection substrate 100. The interconnection substrate 100 on which the chips 150-1-150-4 are mounted constitutes an electronic package 192, which may be one of the electronic devices. The electronic package 192 may have bumps formed at the bottom of the interconnection substrate 100 and is further mounted on a mother board 180 through package interconnections 182 between the bumps of the interconnection substrate 100 and electrodes formed on the mother board 180. The final assembly product 190 including the interconnection substrate 100, the chips 150 and the mother board 180 may also be one of the electronic devices.

The plurality of chips 150 can communicate with each other through the interconnection layer 130 while the chips 150 are connected with the mother board 180 through the internal structure of the organic base substrate 110. Thus, the interconnection substrate 100 provides a chip-to-chip interconnect bridge functionality by using the interconnection layer 130 that is formed merely in the defined area 110a on the organic base substrate 110 and pitch adaptation functionality through other area of the organic base substrate 110.

Figure 7A:
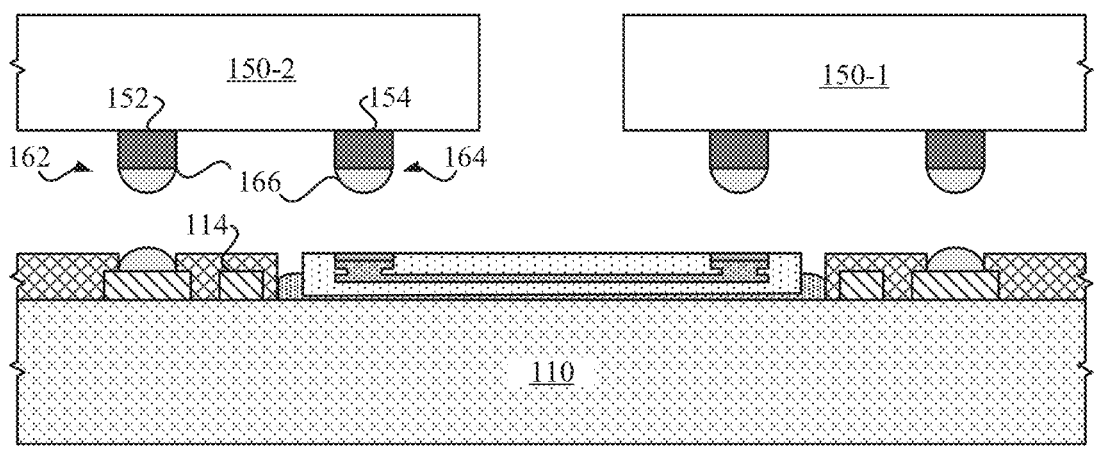
FIG. 7A illustrates a cross-sectional view of the electronic device before chip mounting according to an embodiment of the present invention.
Figure 7B:
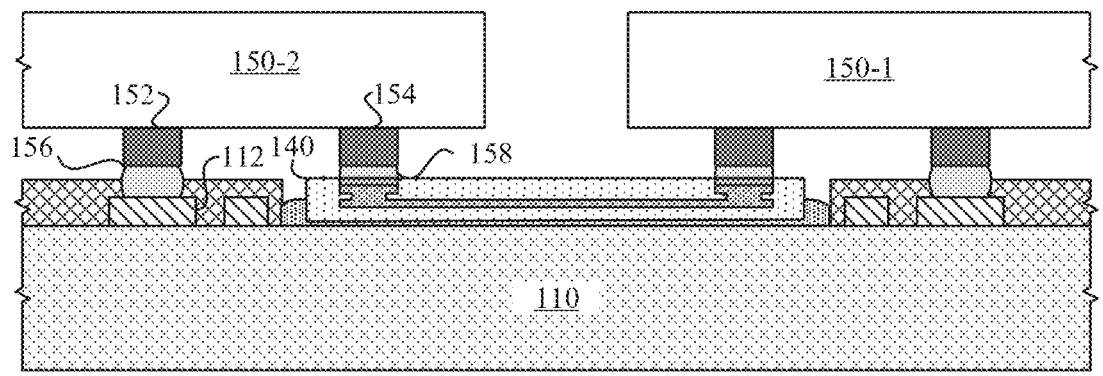
FIG. 7B illustrates a cross-sectional view of the electronic device after chip mounting according to an embodiment of the present invention.
Figure 7C:
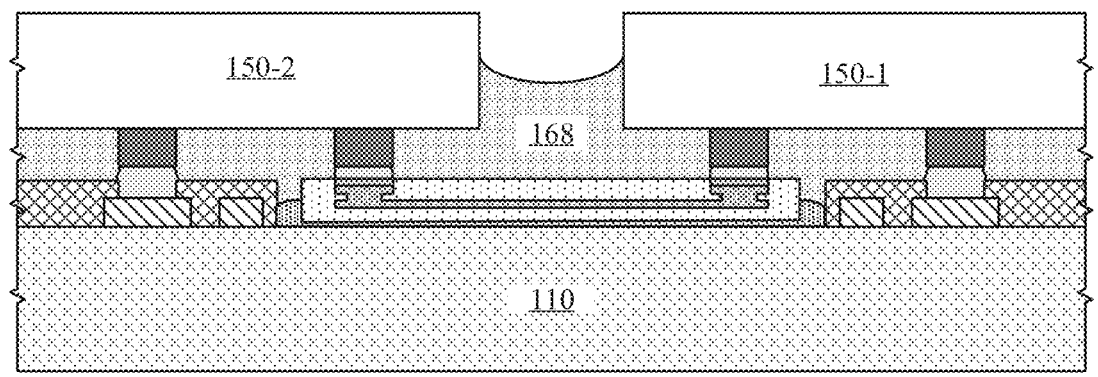
FIG. 7C illustrates a cross-sectional view of the electronic device after chip mounting and underfilling according to an embodiment of the present invention.

Referring to FIGS. 7A-7C, a fabrication process of the electronic device that is subsequently performed after the fabrication process of the interconnection substrate according to the exemplary embodiment of the present invention. FIGS. 7A-7C illustrate cross-sectional views of structure being obtained at each step of the fabrication process of the electronic device 190.

As shown in FIG. 7A, the fabrication process of the electronic device may include a step of placing chips 150 with it active surface facing down onto the interconnection substrate 100. The first chip 150-1 may be located at a position corresponding to the first group of the electrodes 112-1 and the first set of the pads 140-1 of the interconnection layer 130. The second chip 150-2 maybe located at a position corresponding to the second group of the electrodes 112-2 and the second set of the pads 140-2 of the interconnection layer 130.

The chips 150 prepared for this step may include bumps 162, 164, each of which may be made up of the pillar 152/154 and a solder cap 166 formed thereon. In the described embodiment, the bumps 162, 164 are Cu pillar bumps. However, in other embodiment, the bump 162/164 may be any one of standard bumps including standard flip-chip bump, fine-pitch, micro-bump, Cu pillar bump, Cu post bump with Sn a cap (SLID), etc. In the described embodiment, there is no solder on the pads 140 of the interconnection substrate 100 prepared for this step since each pad 140 has the metal stack 138 on top, which improves wettability. However, applying solder onto the pads 140 of the interconnection layer 130 before chip mounting is not excluded.

As shown in FIG. 7B, the fabrication process of the electronic device may include a step of forming solder interconnection 156, 158 between the electrodes and pads 112, 140 and the pillars 152, 154 by solder reflow process.

As shown in FIG. 7C, the fabrication process of the electronic device may include a step of dispensing a underfill 168 to fill a gap between the interconnection substrate 100 and the chips 150 by capillary flow underfill process, followed by curing so as to fix the first chip 150-1 and the second chip 150-2 to the interconnection substrate 100.

In the described embodiment, the underfill 168 is described as being applied onto the organic base substrate 110 after it has been subjected to the reflow treatment. However, in other embodiment, no-flow underfill may be dispensed on the interconnection substrate 100 at first. Then, chips 150 are placed on the interconnection substrate 100 where the underfill has been dispensed. Finally, forming of the solder interconnections 156, 158 and curing of the underfill are performed by a reflow treatment, simultaneously. In the described embodiment, solder reflow process is used as bonding process. However, in other embodiment, thermal compression (TC) bonding process may also be contemplated instead of the solder reflow process.

Since the electrical connection between the chip 150 and the interconnection substrate 100 are achieved by forming solder interconnection between the bump 162/164 and electrodes 112/pads 140, the solder resist layer 116 and the interconnection layer 130 have identical or similar top levels so that difference in the top levels between the solder resist layer 116 and the interconnection layer 130 is in a range capable of being absorbed by forming solder interconnections 156, 158. Since the height of the top surface 130a of the interconnection layer 130 is controlled with respect to the top planar surface 116a of the solder resist layer 116, yield and reliability of the interconnections between the bumps 162/164 and electrodes 112/pads 140 can be improved even if the density of the interconnections becomes higher and the pitch between the pads and/or electrodes becomes narrower. The interconnection substrate 100 can provide an improved reliability for fine pitch interconnections with the chips mounted thereon.

In the exemplary embodiment, each pad 140 configured to receive a peripheral bump 164 of the chips 150 is described as being outermost one as shown in the aforementioned figures. However, in other embodiments, there are other pads 140 configured to receive other peripheral bumps, each of which may be a second-outermost bump or more inner bump. Thus, the peripheral bumps 164 that are received by the pads 140 may include second-outermost or more inner bumps in addition to the outermost bumps. Accordingly, the pads 140 may include a pad configured to receive a second-outermost or more inner bump in addition to a pad configured to receive an outermost bump.

Figure 8:
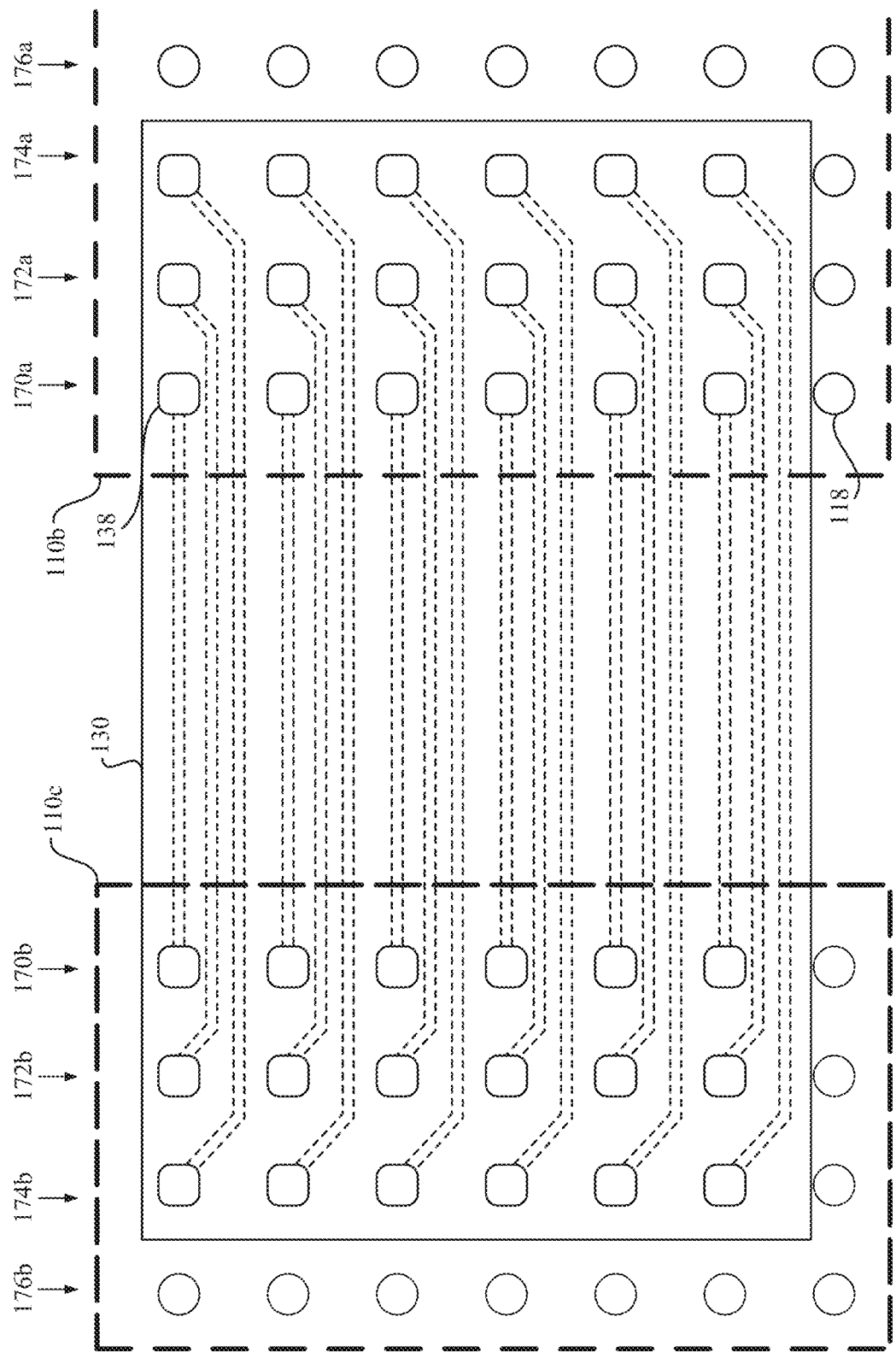
FIG. 8 illustrates a schematic of a layout of pads and traces in the interconnection layer according to a particular embodiment of the present invention.

Referring to FIG. 8, a schematic of a layout of pads and traces in interconnection layer 130 according to a particular embodiment of the present invention is shown. Note that the pre-solders 118 formed on the electrodes 112 and the metal stack 138 of the pads 140 are depicted in view of FIG. 8. As shown in FIG. 8, there are innermost (or third outermost) pads 170a, 170b for outermost bumps, second-outermost pads 172a, 172b for second-outermost bumps, and outermost pads 174a, 174b for third-outermost bumps for each flip-chip area 110b, 110c. In such manner, high density interconnections between chips 150 can be achieved.

Note that the layout of the pads and the traces in the interconnection layer described in FIG. 8 is depicted as having a single wiring layer. However, in other embodiments, the interconnection layer 130 may have a plurality of wiring layers and insulating layers in order to achieve further higher density of interconnections.

Figure 9A:
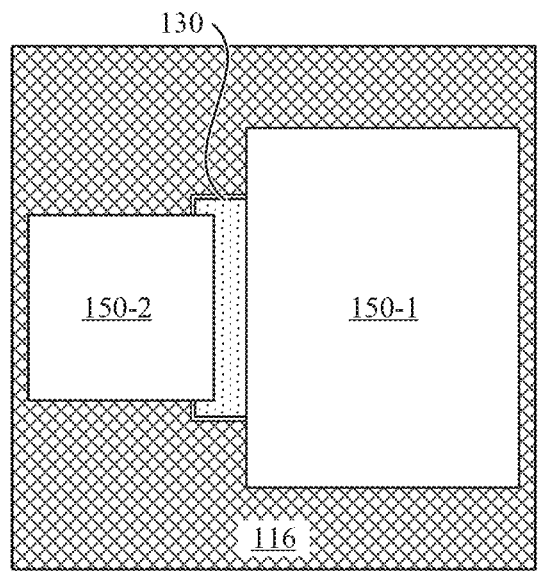
FIG. 9A depicts a schematic of an electronic device including the interconnection substrate with two chips mounted according to another embodiments of the present invention.
Figure 9B:
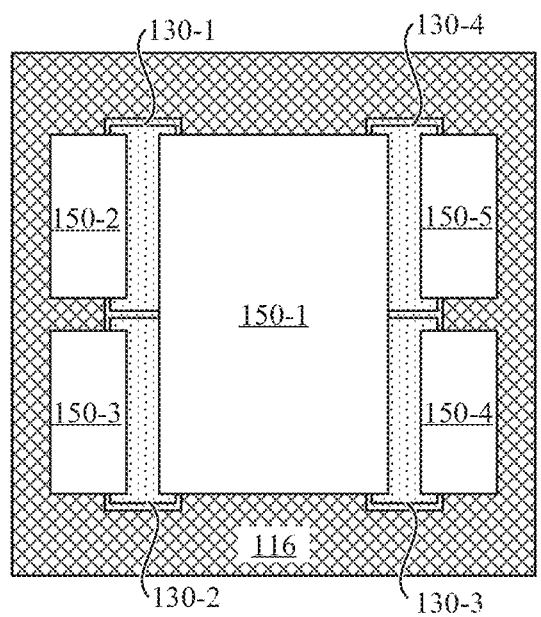
FIG. 9B depicts a schematic of an electronic device including the interconnection substrate with five chips mounted according to another embodiments of the present invention.

Referring to FIGS. 9A-9B, schematics of an electronic device that includes the interconnection substrate according to other particular embodiments of the present invention are described.

FIG. 9A shows a top view of an interconnection substrate 100 of an electronic device having two chips 150-1, 150-2 mounted thereon. As shown in FIG. 9A, the two chips 150-1, 150-2 communicates with each other through single interconnection layer 130. Each chip 150 may be any kind of electronic devices including digital logic chip, memory chip, RF/analog chip, etc.

FIG. 9B shows a top view of an interconnection substrate 100 of other electronic device having one central chip 150-1 and four peripheral chips 150-2~150-5 mounted thereon. The central chip (e.g. CPU, GPU, SoC) can access the peripheral chips (e.g., HBM (High Bandwidth Memory) through respective interconnection layers 130-1~130-4.

In the aforementioned embodiment, the top surface 130a of the interconnection layer 130 has been described to be flush with the top planar surface 116a of the solder resist layer 116. However, it is not necessary that the top surface 130a of the interconnection layer 130 and the top planar surface 116a of the solder resist layer 116 are at the same level. As described above, the mixed pitch and/or mixed size bumps may be also contemplated. Therefore, in other embodiment, the level of the top surface 130a of the interconnection layer 130 and the level of the top planar surface 116a of the solder resist layer 116 can be adjusted by using an appropriate spacer that is inserted between the extended parts 122a of the support substrate 112 and the solder resist layer 116 so as to have a suitable level difference.

Figure 10A:
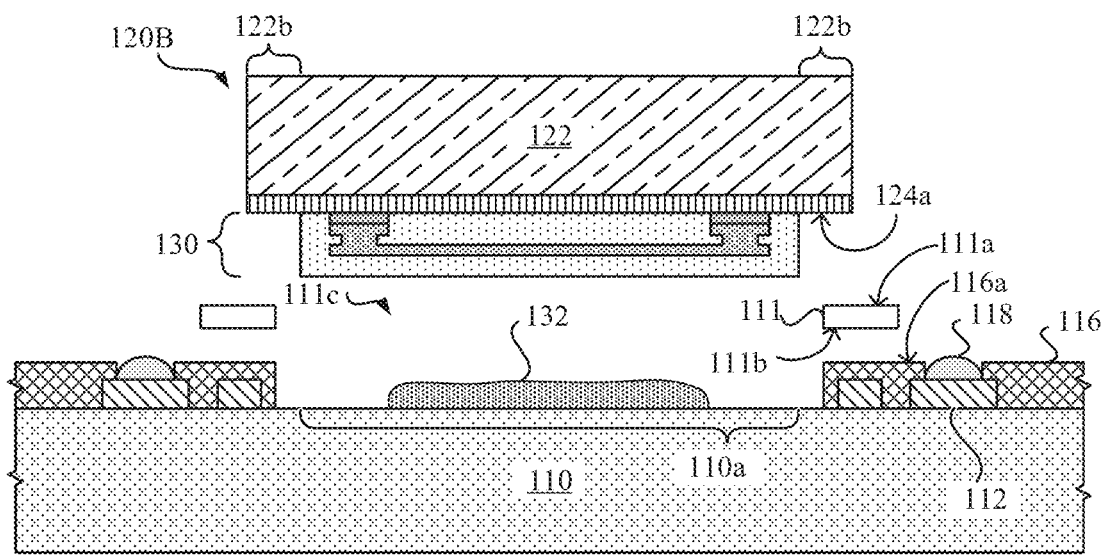
FIG. 10A illustrates a cross-sectional view of the interconnection layer mounted on the interconnection layer structure positioned over the interconnection substrate with spacers positioned therebetween according to a variant embodiment of the present invention.
Figure 10B:
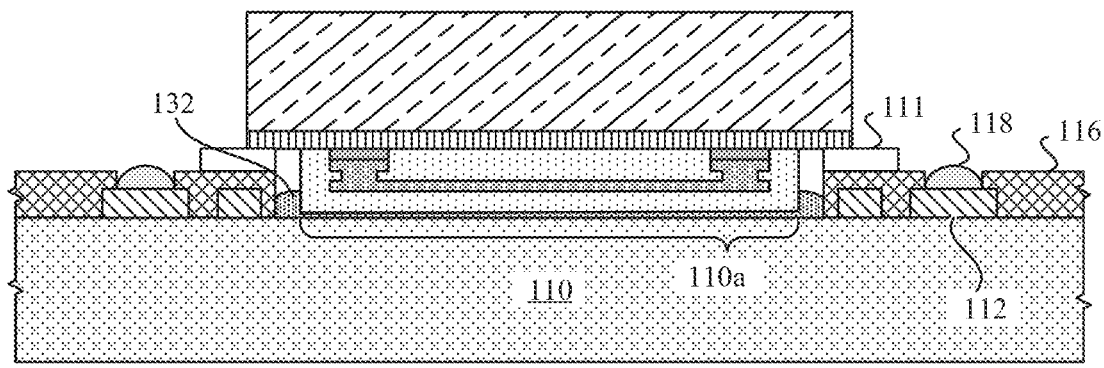
FIG. 10B illustrates a cross-sectional view of the interconnection layer mounted on the interconnection substrate by the interconnection layer structure and supported by the spacers according to a variant embodiment of the present invention.
Figure 10C:
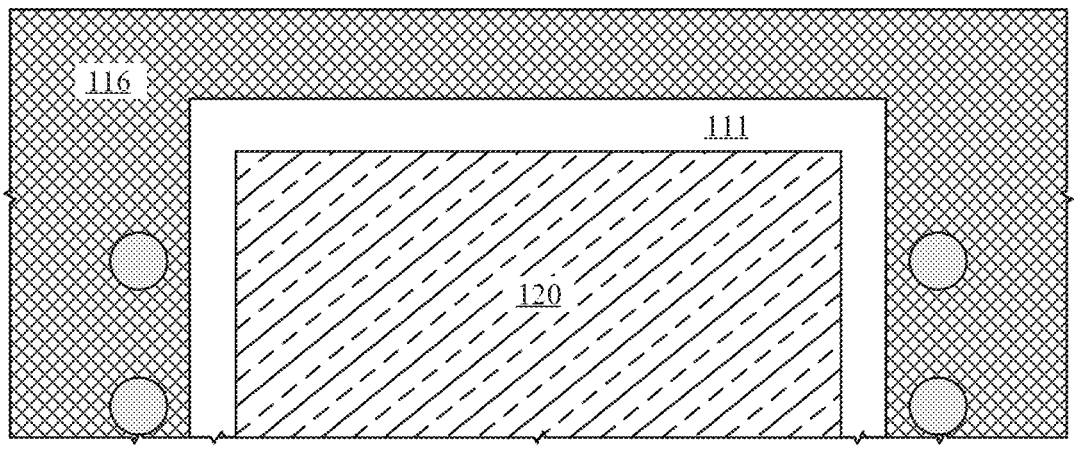
FIG. 10C illustrates a top down view of the interconnection layer mounted on the interconnection substrate by the interconnection layer structure and supported by the spacers according to a variant embodiment of the present invention.

With reference to FIGS. 10A-10C, the fabrication process of the interconnection substrate using the interconnection layer carrying structure according to a variant embodiment of the present invention is described. FIGS. 10A and 10B illustrate cross sectional views of structure being obtained at each step of the fabrication process of the interconnection substrate. FIG. 10C shows a top view of the structure corresponding to the structure shown in FIG. 10B.

As shown in FIG. 10A, the fabrication process may include a step of preparing the organic base substrate 110, the interconnection layer carrying structure 120B and a frame-type spacer 111. The frame-type spacer 111 prepared by this step may have a thickness corresponding to an amount of adjustment to be performed to have the suitable level difference. The frame-type spacer 111 has a bottom planar surface 111b that is configured to abut against the top planar surface 116a of the solder resist layer 116. The frame-type spacer 111 also has a top planar surface 111a that is configured to abut against the planar surface 124a of the extended part 112b of the support substrate 122.

The frame-type spacer 111 has a frame shape that includes an opining through which the interconnection layer 130 passes. The shape of the spacer is not limited to the frame, other shapes such as a shape of a letter "U", a shape of paired plates, etc. The frame-type spacer 111 may be made of any metal or glass such that the spacer 111 held firmly the extended part 122b of the support substrate 122.

In similar to the aforementioned exemplary embodiment, the fabrication process may further include a step of applying an adhesive 132 onto the organic base substrate 110 within the defined area 110a.

As shown in FIG. 10B, the fabrication process may include a step of placing the interconnection layer carrying structure 120B onto the organic base substrate 110 by leveraging the extended parts 122b of the support substrate 122. The step of placing the interconnection layer carrying structure 120B may include a sub-step of leveling the planar surfaces 124a of the extended parts 122b by way of abutment of the extended part 122b such that the planar surfaces 124a of the extended parts 122b become approximately parallel to the top planar surface 116a of the solder resist layer 116 of the organic base substrate 110.

In the variant embodiment shown in FIGS. 10A-10C, the sub-step of leveling of the planar surfaces 124a of the extended parts 122b is performed by placing the frame-type spacer 111 onto the solder resist layer 116 and making the planar surface 124a of the extended part 122b of the support substrate 122 abut against the top planar surface 111a of the frame-type spacer 111a directly or indirectly via the release layer 124 so that the planar surface 124a of the extended part 122b of the support substrate 122 becomes approximately parallel to the top planar surface 116a of the solder resist layer 116 of the organic base substrate 110.

After the step of placing the interconnection layer carrying structure 120B onto the organic base substrate, the step of curing the adhesive 132 (FIG. 3B), the step of releasing the interconnection layer 130 (FIG. 4A), the step of performing the cleaning of the residuals (FIG. 4B) and/or the step of performing the etching of the surfaces of the pads 140 (FIG. 4C) may also be performed as similar to the aforementioned exemplary embodiment.

The interconnection substrate 100 obtained by the fabrication process shown in FIGS. 10A-10C can be passed to a subsequent process such as chip mounting process in similar to the aforementioned exemplary embodiment. In the variant embodiment, the spacer 111 enables to adjust the height of the interconnection layer 130B with higher accuracy. The frame-type spacer 111 can be removed after the attachment of the interconnection layer 130.

Hereinafter, referring to FIGS. 11A-11F, FIGS. 12A-12E, FIGS. 13A-13D and FIGS. 14A-14D, a process for fabricating an interconnection layer carrying structure, which can be used to transfer an interconnection layer onto an organic base substrate, according to an exemplary embodiment of the present invention is described. A series of FIGS. 11A-11F, FIGS. 12A-12E, FIGS. 13A-13D and FIGS. 14A-14D illustrates cross-sectional views of structure being obtained at each step of the fabrication process of the interconnection layer carrying structure 120.

As shown in FIG. 11A, the fabrication process of the interconnection layer carrying structure 120 may include a step of preparing an support substrate 200. The support substrate 200 is suitably any substrate as long as it provides adequate rigidity and stability. In a preferable embodiment, the support substrate 200 prepared by this step may be a glass wafer or a glass panel. The thickness of the support substrate 200 may range from several hundreds of micrometers to several millimeters, for example.

As shown in FIG. 11B, the fabrication process may include a step of applying a release layer 202 onto the support substrate 200. The release layer 202 may be formed by virtually any standard means including spin coating. In one embodiment, the thickness of the release layer 202 may be approximately or less than 1 μm (micrometer), for example.

As shown in FIG. 11C, the fabrication process may include a step of forming a first seed metal layer 204 onto the release layer 202. The first seed metal layer 204 may be formed on the release layer 202 by virtually any standard means including sputtering and electroless plating. In a particular embodiment, a titanium layer and a copper layer (Ti/Cu stacks) are formed by sputtering on the release layer 202 to obtain the first seed metal layer 204. The total thickness of the seed metal layer 204 may range from several tens of nanometers to several hundreds of nanometers. In one embodiment, the titanium layer may have several tens of nanometers thickness and the copper layer may have several tens of nanometers the thickness.

As shown in FIG. 11D, the fabrication process may include a step of depositing a plating resist 206 onto the first seed metal layer 204. In a particular embodiment, the plating resist 206 may be made of any one of photosensitive resins. The thickness of the plating resist 206 may range from several micrometers to several tens of micrometers. The plating resist 206 may be formed by virtually any standard means including spin coating.

As shown in FIG. 11E, the fabrication process may include a step of making a plurality of a openings 206a, which corresponds to the set of the pads 140 shown in FIG. 2, into the plating resist 206. The openings 206a may be fabricated by virtually any standard means including photolithography. In a particular embodiment, the photosensitive resin deposited by spin coating is exposed through a photomask 208 and developed to make the openings 206a. In a particular embodiment, the diameter of the opening 206a may range from 5 to 25 μm (micrometers) with a pitch ranging from 10 to 40 μm (micrometers).

As shown in FIG. 11F, the fabrication process may further include a step of forming metal stacks 210 onto the first seed metal layer 204 at positions of the openings 206a. In a particular embodiment, each metal stack 210 is an Au/Pd/Ni metal stack, which may include a gold layer on the first seed metal layer 204, a palladium layer on the gold layer and a nickel layer on the palladium layer so that the gold layer becomes top when the resultant interconnection layer 130 is transferred onto the organic base substrate 110 in the fabrication process of the interconnection substrate 100. The metal stack 210 may be formed by virtually any standard metallization process, which may include electrolytic plating on the first seed metal layer 204.

Figure 12A:
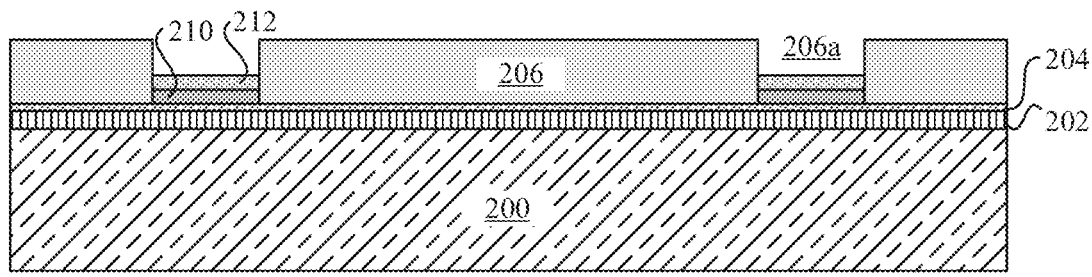
FIG. 12A illustrates a cross-sectional view of a conductive layer deposited in the openings of the carrying structure of FIG. 11E according to the exemplary embodiment of the present invention.

As shown in FIG. 12A, the fabrication process may include a step of depositing an additional conductive layer 212 on the metal stacks 210. The additional conductive layer 212 may be formed by virtually any standard means including electroplating. In a particular embodiment, a copper is deposited by electroplating to form the additional conductive layer 212.

Figure 12B:
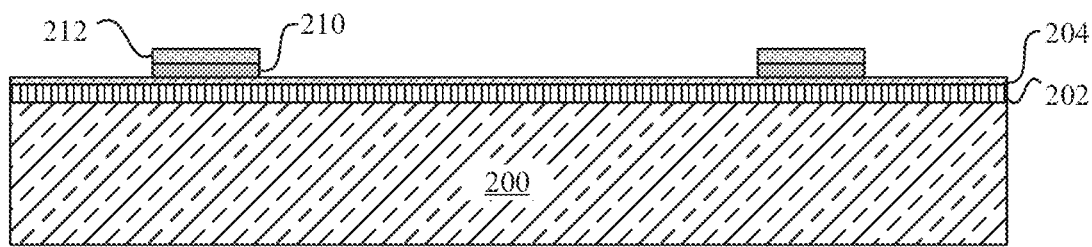
FIG. 12B illustrates a cross-sectional view of the plating resist removed from the carrying structure of FIG. 12A according to the exemplary embodiment of the present invention.

As shown in FIG. 12B, the fabrication process may include a step of removing the plating resist 206 from the first seed metal layer 204.

Figure 12C:
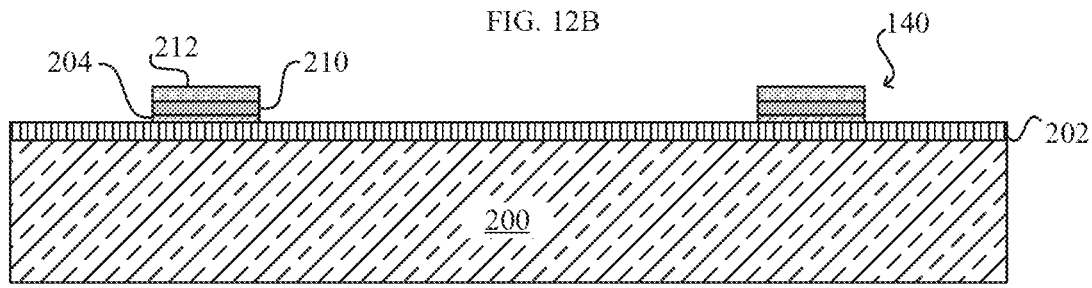
FIG. 12C illustrates a cross-sectional view of the first seed metal layer removed from the carrying structure of FIG. 12B according to the exemplary embodiment of the present invention.

As shown in FIG. 12C, the fabrication process may include a step of removing the first seed metal layer 204 that is exposed from the metal stacks 210, 212.

By performing the steps shown in FIGS. 11C-11F and 12A-12C, a set of pads 140 is built on the release layer 202.

Figure 12D:
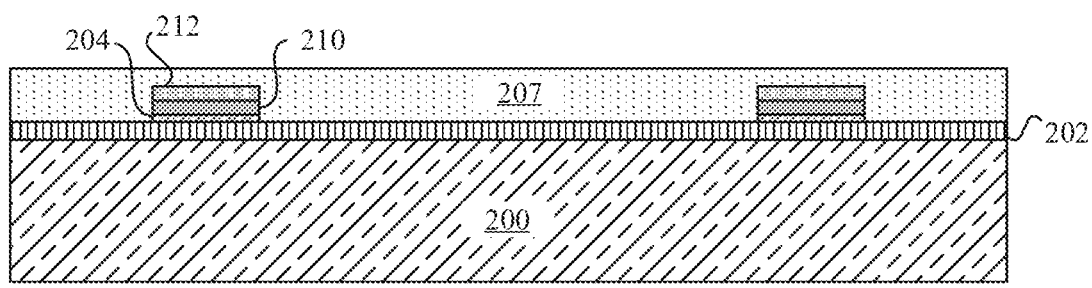
FIG. 12D illustrates a cross-sectional view of a first organic insulating material layer deposited over the carrying structure of FIG. 12C according to the exemplary embodiment of the present invention.

As shown in FIG. 12D, the fabrication process may include a step of depositing a first organic insulating material layer 207 over the set of the pads 140 (including the first seed metal layer 204, the metal stacks 210 and the additional conductive layer 212) and the release layer 202. In a particular embodiment, the first organic insulating material layer 207 may be made of any one of photosensitive insulating resins. The thickness of the first organic insulating material layer 207 may range from several micrometers to several tens of micrometers. The first organic insulating material layer 207 may be formed by virtually any standard means including spin coating.

Figure 12E:
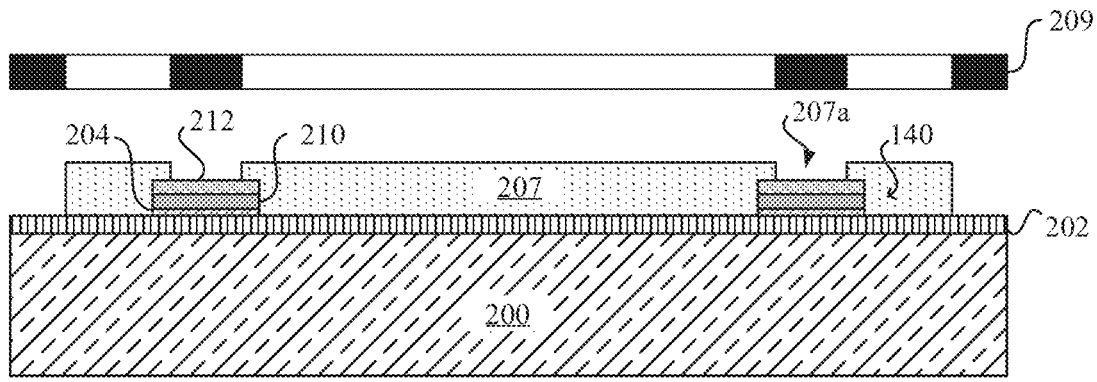
FIG. 12E illustrates a cross-sectional view of openings formed through a photomask in the first organic insulating material layer of the carrying structure of FIG. 12D according to the exemplary embodiment of the present invention.

As shown in FIG. 12E, the fabrication process may include a step of developing the first organic insulating material layer 207 such that the first organic insulating material layer 207 is confined within the predefined area, which corresponds to the base part 122a of the support substrate 122 and has a plurality of a via openings 207a at the positions of the pads 140. The via openings 207a and the outer shape of the first organic insulating material layer 207 may be fabricated by virtually any standard means including photolithography. In a particular embodiment, the photosensitive insulating resin deposited by spin coating is exposed through a photomask 209 and developed to make the via openings 207a and the outer shape of the first organic insulating material layer 207. In other embodiment where a non-photosensitive insulating resin is used to form the first organic insulating material layer 207, the openings and the outer shape may be fabricated by laser processing. In a particular embodiment, the diameter of the via opening 207a may range from 5 to 25 µm (micrometers).

By performing the steps shown in FIGS. 12D and 12E, the structure of the first organic insulating material layer 207 that has the plurality of the openings 207a located at respective positions and is formed within the predetermined region can be preferably formed.

Figure 13A:
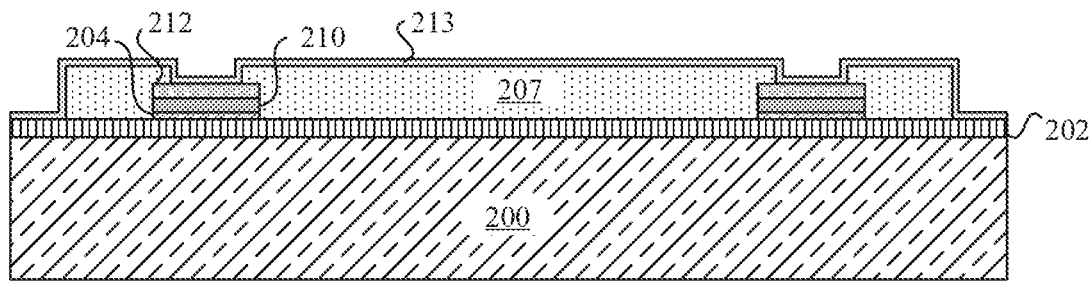
FIG. 13A illustrates a cross-sectional view of a second seed metal layer formed over the carrying structure of FIG. 12E according to the exemplary embodiment of the present invention.

As shown in FIG. 13A, the fabrication process may include a step of forming a second seed metal layer 213 onto the first organic insulating material layer 207, exposed surfaces in the via openings 207a and exposed surfaces of the release layer 202. The second seed metal layer 213 may be formed by virtually any standard means including sputtering and electroless plating. In a particular embodiment, a copper is deposited by sputtering or electroless plating to form the second seed metal layer 213.

Figure 13B:
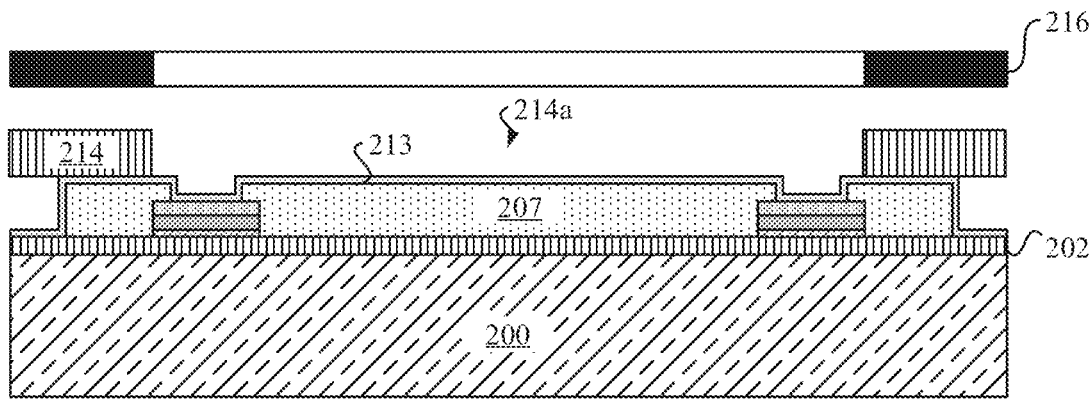
FIG. 13B illustrates a cross-sectional view of a photomask for patterning a film resist of FIG. 13A according to the exemplary embodiment of the present invention.

As shown in FIG. 13B, the fabrication process may include a step of patterning a film resist 214 placed on the second seed metal layer 213 so that the film resist 214 has a plurality of openings 214a. Each opening 214a may be located at a region corresponding to paired pads to be connected from among the set of the pads. The film resist 214 may be patterned by virtually any standard means including photolithography. In a particular embodiment, the film resist 214 disposed on the second seed metal layer 213 is exposed through a photomask 216 and developed to form the patterned openings 214a.

Figure 13C:
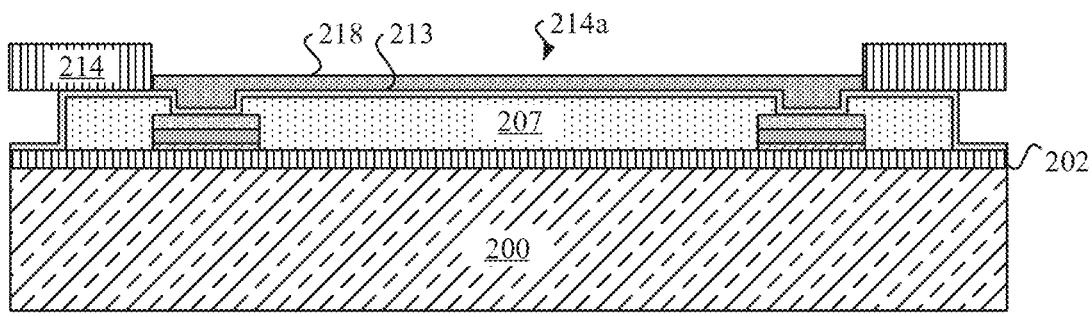
FIG. 13C illustrates a cross-sectional view of a conductive material formed on the second seed metal layer of the carrying structure of FIG. 13B according to the exemplary embodiment of the present invention.

As shown in FIG. 13C, the fabrication process may include a step of depositing conductive material 218 in the plurality of the openings 214a with the predetermined pattern. In a particular embodiment, the conductive material 218 may be a Cu, which may be formed by virtually any standard metallization process including electrolytic plating on the second seed metal layer 213.

Figure 13D:
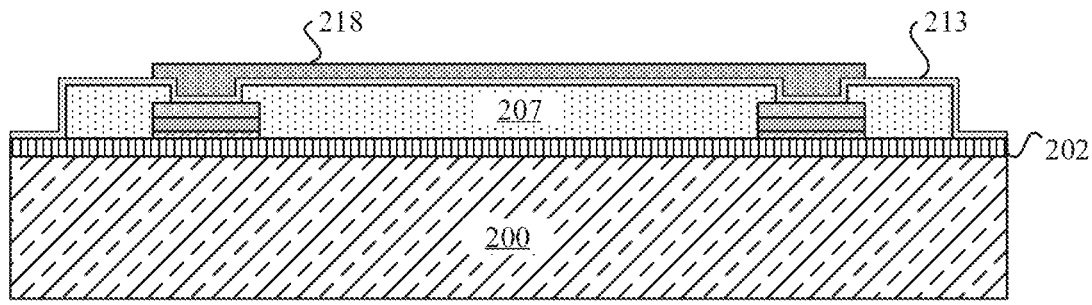
FIG. 13D illustrates a cross-sectional view of the carrying structure of FIG. 13C with the film resist removed according to the exemplary embodiment of the present invention.

As shown in FIG. 13D, the fabrication process may include a step of stripping the film resist 214 from the second seed metal layer 213. By performing the steps shown in FIGS. 13B-13D, the conductive material 218 having the predetermined pattern are deposited on the second seed metal layer 213.

Figure 14A:
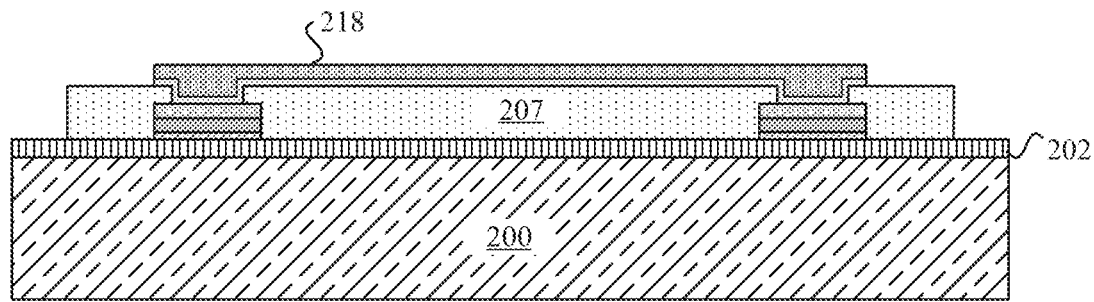
FIG. 14A illustrates a cross-sectional view of exposed portions of the second seed metal layer removed from the carrying structure of FIG. 13D according to the exemplary embodiment of the present invention.

As shown in FIG. 14A, the fabrication process may include a step of removing the second seed metal layer 213 that may include a part outside the predetermined pattern of the conductive material 218.

By performing the steps shown in FIGS. 13A-13D and FIG. 14A, the plurality of the traces are built on the first organic insulating material layer 207. In a preferable embodiment, the traces in the interconnection layer 130 can have a wiring density of line/space=2/2 micrometers. The thickness of the traces may be several micrometers.

Figure 14B:
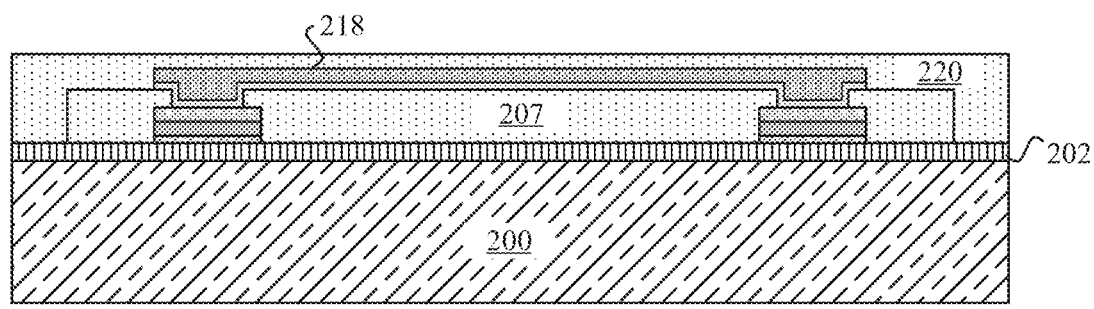
FIG. 14B illustrates a cross-sectional view of a second organic insulating material layer formed over the carrying structure of FIG. 14A according to the exemplary embodiment of the present invention.

As shown in FIG. 14B, the fabrication process may further include a step of forming a second organic insulating material layer 220 over the conductive material (traces) 218 and the first organic insulating material layer 207 by depositing organic insulating material. In a particular embodiment, the second organic insulating material layer 220 may be made of any one of photosensitive insulating resins. The second organic insulating material layer 220 may be formed by virtually any standard means including spin coating.

Figure 14C:
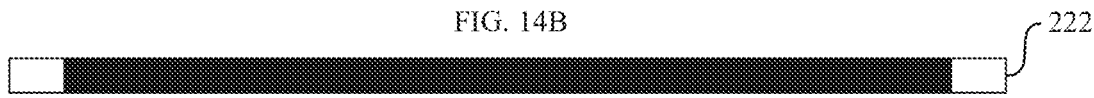
FIG. 14C illustrates a cross-sectional view of patterning second organic insulating material layer of FIG. 14B through a photomask according to the exemplary embodiment of the present invention.
Figure 14C:
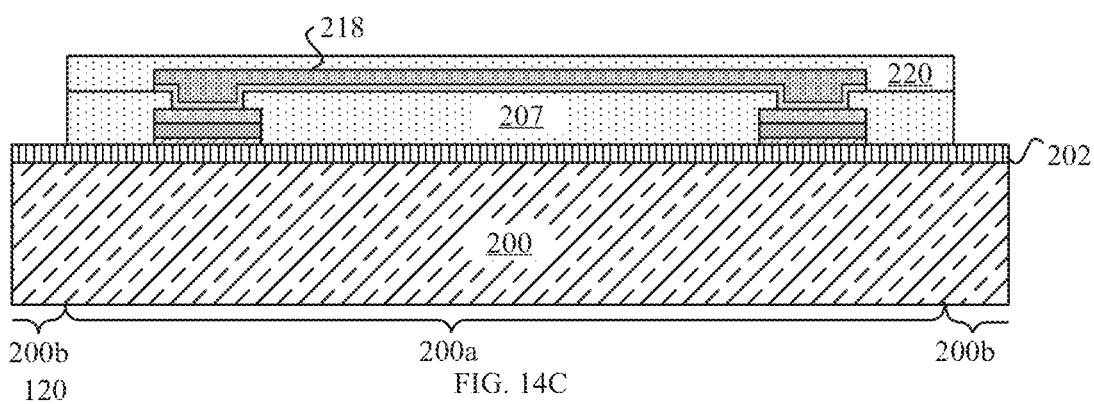

As shown in FIG. 14C, the fabrication process may include a step of developing the second organic insulating material layer 220 such that the second organic insulating material 220 is confined within the predefined area 200a, which corresponds to the base part 122a of the support substrate 122. The outer shape of the second organic insulating material layer 220 which corresponds to the base part 122a, may be fabricated by virtually any standard means including photolithography. In a particular embodiment, the photosensitive insulating resin deposited by spin coating is exposed through a photomask 222 and developed to form the outer shape. In other embodiment where a non-photosensitive insulating resin is used to form the second organic insulating material layer, the outer shape may be fabricated by laser processing.

By performing the steps shown in FIGS. 14B-14C, the organic insulating material layer 207, 220 is formed over the set of the pads 140 within a predefined area of the support substrate such that the support substrate 200 has a base part 200a corresponding to the predefined area and extended parts 200b extending outside the base part 200a.

Figure 14D:
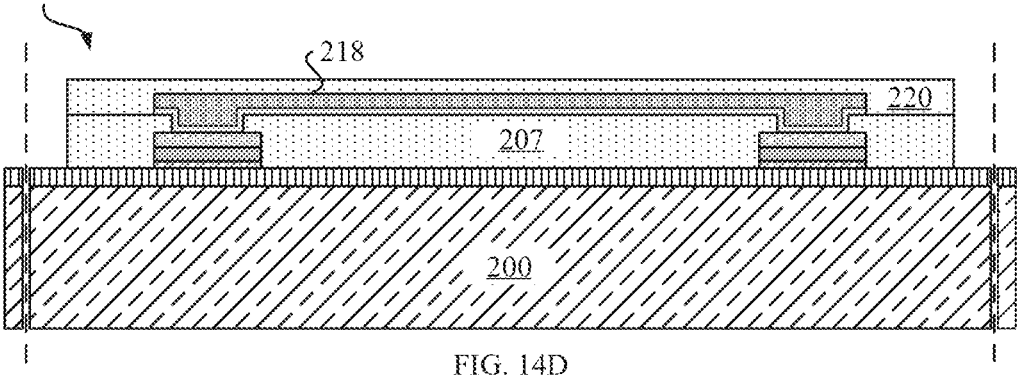
FIG. 14D illustrates a cross-sectional view of dicing the carrying structure of FIG. 14C according to the exemplary embodiment of the present invention.

As shown in FIG. 14D, the fabrication process may further include a step of dicing the support substrate 200, which may be the glass wafer or the glass panel, with its superstructure (including the release layer 202), to obtain an individual structure identical to the interconnection layer carrying structure 120 shown in FIG. 2.

The interconnection layer carrying structure 120 obtained by this process can be passed to a subsequent process such as interconnection substrate fabrication shown in the series of FIGS. 3A-3B and FIGS. 4A-4C. In one embodiment, the interconnection layer carrying structure 120 segmented from the glass wafer or the glass panel by dicing may be provided to next in a production chain. In other embodiment, the interconnection layer carrying structure 120 in a form of wafer or panel as shown in FIG. 14C may be provided to the next in the production chain. The interconnection layer 130 is provided as a form of tape that is formed by organic material and held by the support substrate 122 as rigid backing material that has a width larger than the width of the interconnection layer 130.

In the aforementioned embodiment, it has been described that the plating resist 206 is deposited (FIG. 11D), and removed (FIG. 12B) after forming the metal stack 210 and the additional conductive layer 212 on the release layer 204, followed by the formation of the first organic insulating material layer 207. Such procedure is preferable and makes it possible to remove the most part of the first seed metal layer 204 that is located in an area of the support substrate 122 other than the areas of the pads 140. The removal of the first seed metal layer 204 at the wafer or panel level can facilitate the subsequent process of fabricating the interconnection substrate 100 at chip level since it is easier to remove the rest of the first seed metal layer 204 left on the pad 140 in comparison with removing the whole of the first seed metal layer formed over the support substrate 122 at the etching step shown in FIG. 4C.

However, in other embodiment, the first organic insulating material layer 207 can be formed on the first seed layer 204 without fabricating the plating resist 206 with the openings 206a.

Hereinafter, referring to FIGS. 15A-15C, schematics of a related package structure for electronic devices are described.

Figure 15A:
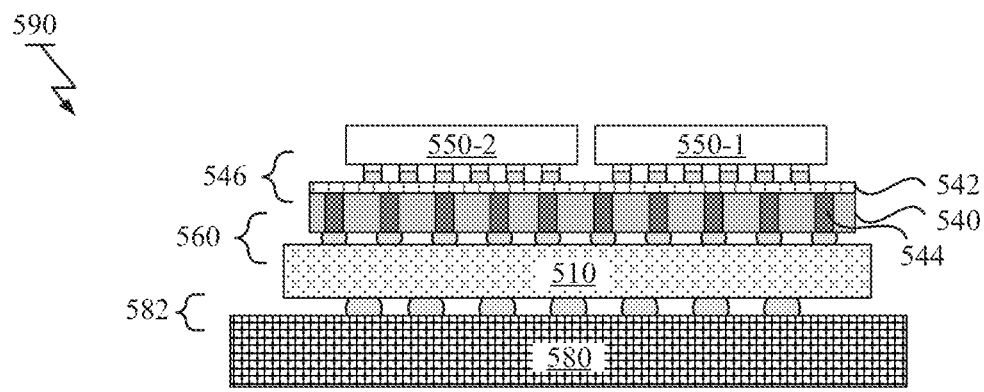
FIG. 15A shows a schematic of a related package structure for electronic devices according to the exemplary embodiment of the present invention.

FIG. 15A shows a schematic of silicon interposer package structure 590. As shown in FIG. 15A, the package structure 590 may include a plurality of chips 550 that are mounted on a silicon interposer 540 through flip-chip interconnections 546 between the chips 550 and the BEOL 542 on the silicon interposer 540. The silicon interposer 540 may have TSVs 544 and bumps formed at the bottom, and may be further mounted on an organic package substrate 510 through interconnections 560. The organic package substrate 510 may have bumps formed at the bottom, and may be further mounted on a mother board 580 through package interconnections 582.

In the silicon interposer package structure 590, fabrication processes of the BEOL 542 and the TSVs 544, especially Cu plating during the TSV process, are expensive. Thus, production cost is generally high. Also large insertion loss would be caused in the TSV since the silicon into which the TSVs are fabricated is a semiconductor, not an insulator.

Figure 15B:
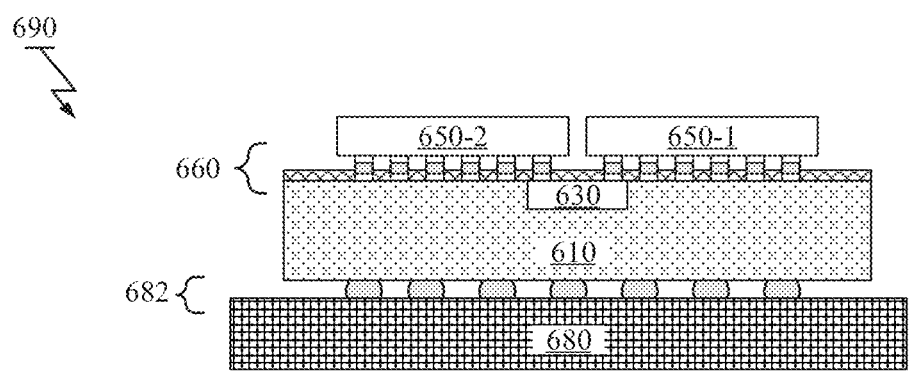
FIG. 15B shows a schematic of a related package structure for electronic devices according to the exemplary embodiment of the present invention.

FIG. 15B shows a schematic of EMIB package structure 690. As shown in FIG. 15B, the package structure 690 may include a plurality of chips 650 that are mounted on an organic package substrate 610 through flip-chip interconnections 660. The organic package substrate 610 includes a silicon bridge interconnect assembly 630 embedded therein, which includes a BEOL. The organic package substrate 610 may have bumps formed at the bottom and may be further mounted on a mother board 680 through package interconnections 682.

Since the bridge interconnect assembly 630 is typically made of semiconductor material such as silicon, a problem of mechanical stress due to CTE mismatch between the organic package substrate 610 and the silicon bridge interconnect assembly 630 would arise, which may results in negative impacts on interconnection reliability and production yield.

Figure 15C:
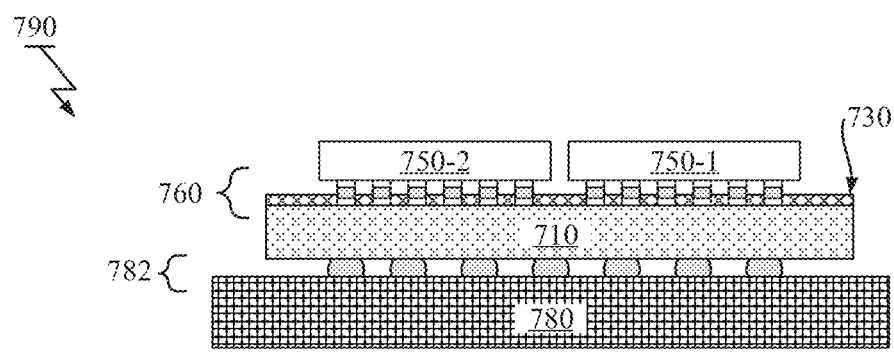
FIG. 15C shows a schematic of a related package structure for electronic devices according to the exemplary embodiment of the present invention.

FIG. 15C shows a schematic of iTHOP package structure 790. As shown in FIG. 15C, the package structure 790 may include a plurality of chips 750 that are mounted on an organic package substrate 710 through flip-chip interconnections 760. The organic package substrate 710 may include an interconnection layer 730 formed over the top surface of the organic package substrate 710. The package substrate 710 may be further mounted on a mother board 780 through package interconnections 782.

In the iTHOP package structure 790, fabrication process includes expensive CMP (Chemical Mechanical Polishing) process as well as delicate fabrication process to form a high density interconnection layer 730 over the package substrate 710. The organic package substrate 710 onto which the interconnection layer is fabricated is generally unstable and warped substrate in comparison with rigid inorganic substrate such as glass. Thus, yield of the interconnection layer 730 itself would be typically low. Furthermore, when the interconnection layer 730 is found to have a defect, it is necessary to discard entire assembly including the organic package substrate 780 that may be buildup substrate since the interconnection layer is built on the organic package substrate 710. Thus, production yield of the electronic package assembly would be lowered and the production cost of the electronic package assembly would be increased. Also, due to the nature of the fabrication process of the interconnection layer 730, it is necessary that the interconnection layer 730 should be formed on the entire top surface of the organic package substrate 780.

In contrast to the aforementioned related package structures, signal transmission between the chips can be achieved through the interconnection layer that includes organic insulating material and is located within the defined area on the base substrate in the interconnection substrate according to one or more embodiments of the present invention.

By employing the structure that enables bonding of the interconnection layer with the base substrate, the base substrate and the interconnection layer having interconnections formed separately from the base substrate can be assembled. The interconnections in the interconnection layer can be precisely formed on another substrate that may be more rigid and stable than the base substrate. Thus, production yield of the interconnection layer is expected to be high even though wiring density increases. With respect to the conventional wring technologies for buildup substrate, line/space of 10/10 μm may be a limit in mass production. On the other hand, according to one or more embodiments of the present invention, it is expected that a wiring density of line/space of 2/2 micrometers can be achieved.

Furthermore, when the interconnection layer is found to have a defect, it is only necessary to discard the interconnection layer instead of entire assembly including the base substrate since the interconnection layer that passes an inspection can be assembled to the base substrate. Therefore, the production yield of the interconnection substrate can be improved and the production cost of the interconnection substrate can be reduced.

Since the CTE of the interconnection layer can be adapted to be close to that of the base substrate than silicon interposer and the embedded silicon interconnect bridge assembly, CTE mismatch between the interconnection layer and the base substrate can be preferably alleviated. Note that the support substrate that may also cause CTE mismatch to the base substrate no longer exists in the interconnection substrate. Furthermore, since the interconnection layer may be provided as being fabricated on a support substrate in a form of tape, interconnection in the interconnection layer can be precisely formed and transferred onto the base substrate efficiently. Thus, production cost of the interconnection substrate can be reduced.

As described above, according to one or more embodiments of the invention, inexpensive, reliable high density interconnections can be achieved for interconnections between chips to be mounted thereon while controlling the height of the interconnection structure on which the chips are to be mounted.

When using the interconnection layer carrying structure according to the embodiment of the present invention to transfer the interconnection layer onto the substrate, the extended part of the support substrate can be used as a guide for leveling the interconnection layer to the substrate. Therefore, the interconnections provided by the interconnection layer transferred onto the substrate would present a high reliability with the fine pitch.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating an interconnection layer carrying structure used for transferring an interconnection layer onto a substrate, the method comprising:
   applying a release layer onto a support substrate;
   building a set of pads on the release layer;
   forming an organic insulating material layer over and above the set of the pads, the organic insulating material layer being formed within a predefined area on the support substrate, wherein the organic insulating material layer overlays a base part of the support substrate corresponding to the predefined area and an extended part of the substrate laterally beyond the predefined area is free from the organic insulating material layer; and
   building a plurality of traces on the organic insulating material layer.

2. The method of claim 1, further comprising:
   forming a second organic insulating material layer over the plurality of the traces and the organic insulating material layer, and wherein the set of pads are in physical contact with the release layer.

3. The method of claim 2, wherein forming the organic insulating material layer comprises:
   depositing a first organic insulating material; and
   developing the first organic insulating material such that the first organic insulating material is confined within the predefined area and has a set of second openings at the positions of the set of the pads.

4. The method of claim 3, wherein building the plurality of the traces comprises:
   forming a second seed layer over the first organic insulating material layer and exposed surfaces in the set of second openings;
   depositing conductive material on the second seed layer with a predetermined pattern; and
   removing portions of the second seed layer free from the conductive material.

5. The method of claim 4, wherein depositing the conductive material comprises:
   patterning a second resist on the second seed layer so that the second resist has a plurality of third openings each located at a region corresponding to paired pads from among the set of the pads;
   depositing a conductive material within the plurality of the third openings; and
   stripping the second resist from the second seed layer.

6. The method of claim 2, wherein forming the second organic insulating material layer comprises:
   depositing a second organic insulating material; and
   developing the second organic insulating material such that the second organic insulating material is confined within the predefined area.

7. The method of claim 1, wherein building the set of the pads comprises:
   forming a first seed layer onto the release layer;
   forming a first resist having a set of first openings corresponding to the set of the pads;
   forming a set of metal stacks on the first seed layer at positions of the set of first openings to obtain the set of the pads;
   removing the first resist; and
   removing the first seed layer exposed from the metal stacks.

8. The method of claim 1, wherein the method further comprises:
   dicing the support substrate to obtain an individual interconnection layer carrying structure.

9. A method for fabricating an interconnection substrate used for interconnecting chips mounted thereon using an interconnection layer carrying structure, the interconnection layer carrying structure comprising an interconnection layer, a release layer on the interconnection layer and a support substrate on the release layer, the interconnection layer comprising an organic insulating material and a set of pads embedded in the organic insulating material, the set of the pads being configured to face towards the support substrate, the support substrate having a base part where the interconnection layer is formed and an extended part extending outside the base part, the method comprising:
   preparing a base substrate provided with a first group of electrodes for a first chip and a second group of electrodes for a second chip thereon; and
   placing the interconnection layer carrying structure onto the base substrate by leveraging the extended part of the support substrate, the interconnection layer of the interconnection layer carrying structure being placed in a defined area on the base substrate between the first group and the second group of the electrodes.

10. The method of claim 9, wherein the base substrate has a first planar surface, the extended part of the support substrate has a second planar surface and placing the interconnection layer carrying structure comprises:

leveling the second planar surface of the extended part by way of abutment of the extended part such that the second planar surface becomes approximately parallel to the first planar surface.

11. The method of claim 10, wherein the base substrate comprises a solder resist layer having the first planar surface, and leveling the second planar surface of the extended part comprises:
making the second planar surface of the extended part of the support substrate abut against the first planar surface of the solder resist layer directly or indirectly via the release layer.

12. The method of claim 10, wherein the base substrate comprises a solder resist layer having the first planar surface, and leveling the second planar surface of the extended part comprises:
placing a spacer having a third planar surface onto the solder resist layer; and
making the second planar surface of the extended part of the support substrate abut against the third planar surface of the spacer directly or indirectly via the release layer so that the second planar surface becomes approximately parallel to the first planar surface.

13. The method of claim 9, wherein the method further comprises:
releasing the interconnection layer from the support substrate by removing the release layer of the interconnection layer carrying structure to leave the interconnection layer on the base substrate such that the set of the pads faces in a direction opposite to the base substrate.

14. The method of claim 13, wherein the support substrate has transparency and removing the release layer comprises:
ablating the release layer by illumination through the support substrate.

15. The method of claim 13, wherein the method further comprises:
applying an adhesive onto the base substrate within the defined area; and
curing the adhesive so that the interconnection layer is bonded to the base substrate.

16. The method of claim 13, wherein the method further comprises:
performing cleaning of residuals on the interconnection layer and/or an etching of surfaces of the pads.

17. The method of claim 9, wherein the set of the pads comprises a first set of pads and a second set of pads and the method further comprises:
placing the first chip onto the interconnection substrate, the first chip being located at a position corresponding to the first group of the electrodes and the first set of the pads of the interconnection layer;
placing the second chip onto the interconnection substrate, the second chip being located at a position corresponding to the second group of the electrodes and the second set of the pads of the interconnection layer; and
fixing the first chip and the second chip to the interconnection substrate.

18. A method for fabricating an interconnection layer carrying structure used for transferring an interconnection layer onto a substrate, the method comprising:
applying a release layer onto a support substrate;
building a set of pads on the release layer;
depositing a first organic insulating material over the set of pads and the release layer;
developing the first organic insulating material such that the first organic insulating material is confined within a predefined area and has a set of second openings at the positions of the set of the pads; and
building a plurality of traces on the first organic insulating material.

19. The method of claim 18, wherein building the set of the pads comprises:
forming a first seed layer on the release layer;
forming a first resist having a set of first openings corresponding to a position for each of the set of the pads;
forming a set of metal stacks on the first seed layer at the positions of the set of first openings to obtain the set of the pads;
removing the first resist; and
removing the first seed layer exposed from the metal stacks.

20. The method of claim 19, wherein building the plurality of the traces comprises:
forming a second seed layer over the first organic insulating material and exposed surfaces in the set of second openings;
depositing conductive material on the second seed layer with a predetermined pattern; and
removing portions of the second seed layer free from the conductive material.

21. The method of claim 20, further comprising depositing a second organic insulating material on the first organic insulating material and conductive material; and
developing the second organic insulating material such that the second organic insulating material is confined within the predefined area.

22. The method of claim 21, wherein depositing the conductive material on the second seed layer comprises:
patterning a second resist on the second seed layer so that the second resist has a plurality of third openings each located at a region corresponding to paired pads from among the set of the pads;
depositing the conductive material within the plurality of the third openings; and
stripping the second resist from the second seed layer.

23. The method of claim 22, wherein the set of pads are in physical contact with the release layer.

24. The method of claim 22, further comprising dicing the support substrate to obtain an individual interconnection layer carrying structure.

* * * * *